(12) United States Patent
Dai

(10) Patent No.: US 9,570,026 B2
(45) Date of Patent: Feb. 14, 2017

(54) SCAN DRIVING CIRCUIT AND LCD DEVICE

(71) Applicant: SHENZHEN CHINA STAR OPTOELECTRONICS TECHNOLOGY CO., LTD, Shenzhen (CN)

(72) Inventor: Chao Dai, Shenzhen (CN)

(73) Assignee: SHENZHEN CHINA STAR OPTOELECTRONICS TECHNOLOGY CO., LTD, Shenzhen (CN)

( * ) Notice: Subject to any disclaimer, the term of this patent is extended or adjusted under 35 U.S.C. 154(b) by 163 days.

(21) Appl. No.: 14/411,105

(22) PCT Filed: Jun. 25, 2014

(86) PCT No.: PCT/CN2014/080721
§ 371 (c)(1),
(2) Date: Dec. 24, 2014

(87) PCT Pub. No.: WO2015/176347
PCT Pub. Date: Nov. 26, 2015

(65) Prior Publication Data
US 2016/0275895 A1    Sep. 22, 2016

(30) Foreign Application Priority Data
May 20, 2014    (CN) .......................... 2014 1 0212400

(51) Int. Cl.
*G09G 3/3266* (2016.01)
*G09G 3/36* (2006.01)
(Continued)

(52) U.S. Cl.
CPC .............. *G09G 3/3677* (2013.01); *G09G 3/36* (2013.01); *G11C 19/00* (2013.01); *G11C 19/28* (2013.01);
(Continued)

(58) Field of Classification Search
None
See application file for complete search history.

(56) References Cited

U.S. PATENT DOCUMENTS 6,556,646 B1    4/2003    Yeo et al.
2007/0086558 A1*    4/2007    Wei .................. G11C 19/28
                                                              377/64

(Continued)

FOREIGN PATENT DOCUMENTS

CN          1862650 A       11/2006
CN        101093647 A       12/2007
(Continued)

OTHER PUBLICATIONS

Wang Shaowei, the International Searching Authority written comments, Mar. 2015, CN.

*Primary Examiner* — Viet Pham
*Assistant Examiner* — Christopher Kohlman

(57) ABSTRACT

A scan driving circuit includes a pull-up assembly, a pull-up control assembly that drives the pull-up assembly, a pull-down maintaining assembly, and a reference low-level signal. When the current scanning line is inactive, the pull-down maintaining assembly is controlled by a pull-down maintaining signal to make a reference low-level signal be sent to an output end of the pull-up control assembly and the current scanning line.

20 Claims, 9 Drawing Sheets

(51) Int. Cl.
 *G11C 19/00* (2006.01)
 *G11C 19/28* (2006.01)
(52) U.S. Cl.
 CPC .... *G09G 2310/061* (2013.01); *G09G 2310/08* (2013.01)

(56) References Cited

U.S. PATENT DOCUMENTS

2009/0167741 A1   7/2009  Tsai
2014/0064439 A1*  3/2014  Qing ..................... G11C 19/28
                                                            377/75

FOREIGN PATENT DOCUMENTS

| CN | 101339809 A | 1/2009 |
| CN | 101369460 A | 2/2009 |
| CN | 101609718 A | 12/2009 |
| CN | 101645308 A | 2/2010 |
| CN | 101783124 A | 7/2010 |
| CN | 102368378 A | 3/2012 |
| CN | 103680453 A | 3/2014 |
| CN | 103745700 A | 4/2014 |
| CN | 103928007 A | 7/2014 |
| CN | 104008740 A | 8/2014 |
| CN | 104008741 A | 8/2014 |
| CN | 104008742 A | 8/2014 |
| JP | 2008193545 A | 8/2008 |

* cited by examiner

SCAN DRIVING CIRCUIT AND LCD DEVICE

TECHNICAL FIELD

The present disclosure relates to the field of display devices, and more particularly to a scan driving circuit and a liquid crystal display (LCD) device.

BACKGROUND

A gate driver on array (GOA) uses an array manufacturing method of a typical thin film transistor liquid crystal display device (TFT LCD), to make a scan driving circuit on an array substrate, which drives a gate scan line stage by stage. When a current scanning line is active, a pull-down maintaining assembly of a typical GOA circuit is at a poor turn-off status, which causes current leakage of an output end Q(N) of a pull-up control assembly and the current scanning line G(N). This is especially true when the current scanning line is active at high temperatures, thus, the current leakage of thin film transistors (TFTs) is increased to further affect stability of the GOA.

SUMMARY

The aim of the present disclosure is to provide a scan driving circuit and a liquid crystal display (LCD) device capable of avoiding current leakage.

The aim of the present disclosure is achieved by the following methods:

A scan driving circuit comprises a pull-up assembly, a pull-up control assembly that drives the pull-up assembly, a pull-down maintaining assembly, a reference low-level signal, and a pull-down maintaining signal. An output end of the pull-up assembly is coupled to a current scanning line, and the reference low-level signal is sent to the output end of the pull-up control assembly and the current scanning line via the pull-down maintaining assembly. The pull-down maintaining signal is sent to a control end of the pull-down maintaining assembly.

When the current scanning line is active, a voltage of the pull-down maintaining signal is less than a voltage of the reference low-level signal, and the pull-down maintaining assembly is controlled by the pull-down maintaining signal to make the reference low-level signal be not sent to the output end of the pull-up control assembly and the current scanning line.

A clock scanning signal is sent to an input end of the pull-up assembly, and a control end of the pull-up assembly is coupled to an output end of the pull-up control assembly. A pull-up control signal is sent to a control end of the pull-up control assembly.

When the current scanning line is inactive, the reference low-level signal is sent to the output end of the pull-up control assembly and the current scanning line via the pull-down maintaining assembly.

Furthermore, the pull-down maintaining assembly comprises a first pull-down maintaining assembly and a second pull-down maintaining assembly. Input ends of the first pull-down maintaining assembly and the second pull-down maintaining assembly are coupled to the output end of the pull-up control assembly, the pull-down maintaining signal is sent to control ends of the first pull-down maintaining assembly and the second pull-down maintaining assembly, and the reference low-level signal is sent to output ends of the first pull-down maintaining assembly and the second pull-down maintaining assembly.

The scan driving circuit further comprises a diverter switch connected between the control ends of the first pull-down maintaining assembly and the second pull-down maintaining assembly, and a control end of the diverter switch is coupled to the output end of the pull-up control assembly.

When the current scanning line is active, the diverter switch turns off the first pull-down maintaining assembly and the second pull-down maintaining assembly, thus, the reference low-level signal is not sent to the output end of the pull-up control assembly and the current scanning line. The first pull-down maintaining assembly and the second pull-down maintaining assembly alternately works, which avoids assembly failure due to long-term work of single assembly.

Furthermore, the pull-down maintaining assembly comprises the first pull-down maintaining assembly comprising a first pull-down maintaining unit and a first pull-down maintaining control unit, the first pull-down maintaining control unit drives the first pull-down maintaining unit. The first pull-down maintaining unit comprises a first controllable switch and a second controllable switch. The pull-down maintaining signal comprises a first pull-down maintaining signal, and the first pull-down maintaining signal is sent to control ends of the first controllable switch and the second controllable switch via the first pull-down maintaining control unit. The reference low-level signal is sent to the current scanning line via the first controllable switch, and is sent to the output end of the pull-up control assembly via the second controllable switch.

When the current scanning line is inactive, the first pull-down maintaining control unit controls the first controllable switch and the second controllable switch to turn on according to the first pull-down maintaining signal. The first controllable switch controls the reference low-level signal to be sent to the current scanning line, and the second controllable switch controls the reference low-level signal to be sent to the output end of the pull-up control assembly.

When the current scanning line is active, the first controllable switch and the second controllable switch turn off. The first controllable switch controls the reference low-level signal to be not sent to the current scanning line, and the second controllable switch controls the reference low-level signal to be not sent to the output end of the pull-up control assembly.

Furthermore, the first pull-down maintaining control unit comprises a third controllable switch, the third controllable switch uses a diode connection method, where the first pull-down maintaining signal is sent to an input end and a control end of the third controllable switch.

Furthermore, the first pull-down maintaining unit further comprises a fourth controllable switch, a control end of the fourth controllable switch is coupled to an output end of the third controllable switch, the first pull-down maintaining signal is sent to an input end of the fourth controllable switch, and an output end of the fourth controllable switch is coupled to the control ends of the first and second controllable switches.

Furthermore, the first pull-down maintaining unit further comprises a fifth controllable switch. The pull-down maintaining signal further comprises a second pull-down maintaining signal, logical operation of the second pull-down maintaining signal is opposite to logical operation of the first pull-down maintaining signal. The second pull-down maintaining signal is sent to a control end of the fifth controllable switch, the first pull-down maintaining signal is sent to an input end of the fifth controllable switch, and an output end of the fifth controllable switch is coupled to the control ends of the first and second controllable switches.

Furthermore, the first pull-down maintaining control unit comprises a third controllable switch, a fourth controllable switch, and a fifth controllable switch. The pull-down maintaining signal further comprises a second pull-down maintaining signal, and logical operation of the second pull-down maintaining signal is opposite to logical operation of the first pull-down maintaining signal. The third controllable switch uses a diode connection method, the first pull-down maintaining signal is sent to an input end and a control end of the third controllable switch. A control end of the fourth controllable switch is coupled to an output end of the third controllable switch, the first and second pull-down maintaining signals are sent to an input end of the fourth controllable switch, and an output end of the fourth controllable switch is coupled to the control ends of the first and second controllable switches. The second pull-down maintaining signal is sent to a control end of the fifth controllable switch, the first pull-down maintaining signal is sent to an input end of the fifth controllable switch, and an output end of the fifth controllable switch is coupled to the control ends of the first and second controllable switches.

Furthermore, the pull-down maintaining assembly further comprises a turn-off unit, and the turn-off unit comprises a sixth controllable switch. A control end of the sixth controllable switch is coupled to the output end of the pull-up control assembly, an input end of the sixth controllable switch is coupled to the control end of the fourth controllable switch, and the reference low-level signal is sent to an output end of the sixth controllable switch.

Furthermore, the pull-down maintaining assembly further comprises a turn-off unit, and the turn-off unit comprises a sixth controllable switch. A control end of the sixth controllable switch is coupled to the output end of the pull-up control assembly, an input end of the sixth controllable switch is coupled to the control end of the fourth controllable switch, and the second pull-down maintaining signal is sent to an output end of the sixth controllable switch. When the current scanning line is active, the sixth controllable switch assist in reducing electric potential of the control end of the fourth controllable switch, which can reduce electric potentials of the control ends of the first and second controllable switches. Thus, the first and second controllable switches turn off, and influence on the GOA due to the first and second controllable switches is avoided.

Furthermore, the pull-down maintaining assembly further comprises the second pull-down maintaining assembly comprising the second pull-down maintaining unit and the second pull-down maintaining control unit, where the second pull-down maintaining control unit drives the second pull-down maintaining unit. The pull-down maintaining signal comprises the second pull-down maintaining signal, where the logical operation of the second pull-down maintaining signal is opposite to the logical operation of the first pull-down maintaining signal. The second pull-down maintaining unit comprises the eighth controllable switch and the ninth controllable switch. The second pull-down maintaining signal is sent to control ends of the eighth and ninth controllable switches via the second pull-down maintaining control unit. The first reference low-level signal is sent to the current scanning line via the eighth controllable switch, and the second reference low-level signal is sent to the output end of the pull-up control assembly via the ninth controllable switch.

When the current scanning line is inactive, the first pull-down maintaining unit and the second pull-down maintaining unit alternately turn on. When the second pull-down maintaining unit turns on, the eighth and ninth controllable switches turn on, thus, the reference low-level signal is sent to the output end of the pull-up control assembly and the current scanning line.

When the current scanning line is active, the first pull-down maintaining unit and the second pull-down maintaining unit turn off, and the first, second, eighth, and ninth controllable switches turn off, thus, the reference low-level signal is not sent to the output end of the pull-up control assembly and the current scanning line. There are two pull-down maintaining assemblies, where the two pull-down maintaining assemblies work alternately to allow one of the two pull-down maintaining assemblies to be at the inactive status for half a work time. Thus, change of the electric potentials of the TFT at turn-on status and turn-off status due to long-time work of single pull-down maintaining assembly is avoided. This, further avoids influence on turn-on of the pull-down maintaining assembly because of the change of the electric potentials of the TFT at turn-on status, and influence on turn-off of the pull-down maintaining assembly because of the change of the electric potentials of the TFT at turn-off status.

Furthermore, the pull-down maintaining assembly further comprises a diverter switch. A control end of the diverter switch is coupled to the output end of the pull-up control assembly, and the diverter switch is arranged between the control ends of the first and second controllable switch and the control ends of the eighth and ninth controllable switch.

When the current scanning line is active, the diverter switch turns on, thus, the first pull-down maintaining unit is connected to the second pull-down maintaining unit, and electric potential of one of the control ends of the first and second pull-down maintaining units, that is at high level, is reduced by electric potential of another control end that is at low level, thus, the first and second pull-down maintaining units turn off. The diverter switch is used to balance the electric potentials of two ends thereof. In the case of the sixth controllable switch is wrong, when the diverter switch is on, the electric potential at point P(N) can be reduced to the electric potential at point K(N) via the diverter switch, which turns off the first, second, eighth, and ninth controllable switches. Thus, influence on the signals of the G(N) and the Q(N), that is caused because the TFTs do not turn off together, is avoided, and influence on the GOA circuit is further avoided.

Furthermore, the second pull-down maintaining control unit comprises a tenth controllable switch, the tenth controllable switch uses a diode connection method, where the second pull-down maintaining signal is sent to an input end and a control end of the tenth controllable switch.

Furthermore, the second pull-down maintaining unit further comprises an eleventh controllable switch, a control end of the eleventh controllable switch is coupled to an output end of the tenth controllable switch, the second pull-down maintaining signal is sent to an input end of the eleventh controllable switch, and an output end of the eleventh controllable switch is coupled to the control ends of the first and second controllable switches.

Furthermore, the second pull-down maintaining unit further comprises a twelfth controllable switch, the first pull-down maintaining signal is sent to a control end of the eleventh controllable switch, the second pull-down maintaining signal is sent to an input end of the twelfth controllable switch, and an output end of the twelfth controllable switch is coupled to the control ends of the first and second controllable switches.

Furthermore, the second pull-down maintaining control unit comprises a tenth controllable switch, an eleventh controllable switch, and a twelfth controllable switch. The tenth controllable switch uses a diode connection method, where the second pull-down maintaining signal is sent to an input end and a control end of the tenth controllable switch. A control end of the eleventh controllable switch is coupled to an output end of the tenth controllable switch, the second pull-down maintaining signals is sent to an input end of the eleventh controllable switch, and an output end of the eleventh controllable switch is coupled to the control ends of the eighth and ninth controllable switches. The first pull-down maintaining signal is sent to a control end of the twelfth controllable switch, the second pull-down maintaining signal is sent to an input end of the twelfth controllable switch, and an output end of the twelfth controllable switch is coupled to the control ends of the eighth and ninth controllable switches.

When the current scanning line is inactive and the second pull-down maintaining assembly turns on, the tenth, eleventh, and twelfth controllable switches control the eighth and ninth controllable switches to turn on according to the first and second pull-down maintaining signals, thus, the reference low-level signal is sent to the output end of the pull-up control assembly and the current scanning line.

Furthermore, the pull-down maintaining assembly further comprises a turn-off unit, and the turn-off unit comprises a thirteenth controllable switch. A control end of the thirteenth controllable switch is coupled to the output end of the pull-up control assembly, an input end of the thirteenth controllable switch is coupled to the control end of the eleventh controllable switch, and the reference low-level signal is sent to an output end of the thirteenth controllable switch. When the current scanning line is active, the thirteenth controllable switch assists in reducing electric potential of the control end of the eleventh controllable switch, which can reduce electric potentials of the control ends of the eighth and ninth controllable switches. Thus, the eighth and ninth controllable switches turn off, and influence on the GOA due to the eighth and ninth controllable switches is avoided.

Furthermore, the pull-down maintaining assembly further comprises a turn-off unit, and the turn-off unit comprises a thirteenth controllable switch. A control end of the thirteenth controllable switch is coupled to the output end of the pull-up control assembly, an input end of the thirteenth controllable switch is coupled to the control end of the eleventh controllable switch, and the first pull-down maintaining signal is sent to an output end of the thirteenth controllable switch.

Furthermore, the first pull-down maintaining signal and the second pull-down maintaining signal are the low-frequency signals. Time of switching the first and second pull-down maintaining signals is the blanking time between each frame image.

Furthermore, the pull-up control assembly comprises a seventeenth controllable switch. An output end of the seventeenth controllable switch is coupled to a control end of the pull-up assembly, and a pull-up control signal is sent to a control end and an input end of the seventeenth controllable switch. The pull-up assembly comprises an eighteenth controllable switch, a control end of the eighteenth controllable switch is coupled to the output end of the pull-up control assembly, a clock scanning signal is sent to an input end of the eighteenth controllable switch, and an output end of the eighteenth controllable switch is coupled to the current scanning line. The scan driving circuit further comprises a storage capacitor, a first end of the storage capacitor is coupled to the output end of the pull-up control assembly, and a second end of the storage capacitor is coupled to the output end of the pull-up assembly.

A liquid crystal display (LCD) device comprises any one of the above-mentioned scan driving circuit.

It should be understood that, when the current scanning line is active, a potential difference Vgs between the control end and the output end of the pull-down maintaining assembly of a typical GOA is greater than zero, namely the pull-down maintaining assembly is at an unstable turn-off status, thereby causing the current leakage of the output end Q(N) of the pull-up control assembly and the current scanning line G(N). This is especially true when the current scanning line is active at high temperatures, the current leakage of thin film transistors (TFTs) is increased and further affects stability of the GOA. In the present disclosure, the pull-down maintaining signal LC having the low level is used, and the electric potential of the pull-down maintaining signal LC is less than the electric potential of the reference low-level signal VSS. When the current scanning line is inactive, the pull-down maintaining assembly is controlled by the pull-down maintaining signal, and makes the reference low-level signal be sent to the output end Q(N) of the pull-up control assembly and the current scanning line G(N). Thus, the electric potentials of the output end Q(N) of the pull-up control assembly and the current scanning line G(N) reduce, and residual electrons of the output end Q(N) of the pull-up control assembly and the current scanning line G(N) are discharged. When the current scanning line is active, the pull-down maintaining signal LC outputs a low electric potential to the control end of the pull-down maintaining assembly, thus, the potential difference Vgs between the control end and the output end of the pull-down maintaining assembly is less than zero, namely the pull-down maintaining assembly is at an stable turn-off status, thereby reducing the current leakage of the output end Q(N) of the pull-up control assembly and the current scanning line G(N), and improving the stability of the GOA at the high temperatures and improving long-term the reliability of the GOA.

DETAILED DESCRIPTION

The present disclosure will further be described in detail in accordance with the figures and the exemplary examples.

Figure 1:
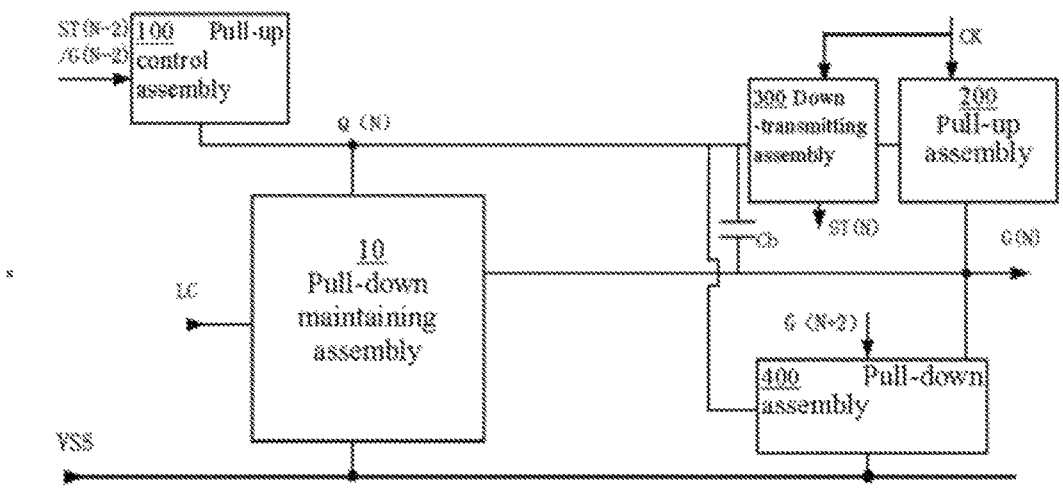
FIG. 1 is a schematic diagram of a scan driving circuit of the present disclosure.

FIG. 1 is a schematic diagram of a scan driving circuit of the present disclosure, the scan driving circuit comprises a pull-up assembly 200, a pull-up control assembly 100 that drives the pull-up assembly 200, a pull-down maintaining assembly 10, and a reference low-level signal VSS. An output end of the pull-up assembly 200 is coupled to a current scanning line G(N), a clock scanning signal CK is sent to an input end of the pull-up assembly 200, and a control end of the pull-up assembly 200 is coupled to an output end Q(N) of the pull-up control assembly 100. A pull-up control signal ST(N−2)/G(N−2) is sent to a control end of the pull-up control assembly 100, where the pull-up control signal ST(N−2)/G(N−2) comprises a previous scanning line G(N−2) and a previous down-transmitting signal ST(N−2). The reference low-level signal VSS is sent to the output end Q(N) of the pull-up control assembly 100 and the current scanning line G(N) through the pull-down maintaining assembly 10. An input end of the pull-down maintaining assembly 10 is coupled to the output end Q(N) of the pull-up control assembly 100, and the reference low-level signal VSS is sent to an output end of the pull-down maintaining assembly 10. The scan driving circuit further comprises a pull-down maintaining signal LC, where the pull-down maintaining signal LC is sent to a control end of the pull-down maintaining assembly 10.

When the current scanning line is inactive, the reference low-level signal VSS is sent to the output end Q(N) of the pull-up control assembly 100 and the current scanning line G(N) via the pull-down maintaining assembly 10.

When the current scanning line G(N) is active, a voltage of the pull-down maintaining signal LC is less than a voltage of the reference low-level signal VSS, and the pull-down maintaining assembly 10 is controlled by the pull-down maintaining signal LC to make the reference low-level signal VSS be not sent to the output end Q(N) of the pull-up control assembly 100 and the current scanning line G(N).

The pull-down maintaining signal LC is a cyclic signal generated by a timing control circuit or other circuits. When the pull-down maintaining signal LC is at a low level (logic 0), the voltage of the pull-down maintaining signal LC is less than the voltage of the reference low-level signal VSS.

The scan driving circuit further comprises a pull-down assembly 400, where an input end of the pull-down assembly 400 is coupled to the current scanning line G(N) and the output end Q(N) of the pull-up control assembly 100, a control end of the pull-down assembly 400 is coupled to a next scanning line G(N+2), and the reference low-level signal VSS is sent to an output end of the pull-down assembly 400.

The scan driving circuit further comprises a storage capacitor Cb, where a first end of the storage capacitor Cb is coupled to the output end Q(N) of the pull-up control assembly 100, and a second end of the storage capacitor Cb is coupled to the output end of the pull-up assembly 200 and the pull-down maintaining assembly 10.

It should be understood that when the current scanning line is active, a potential difference Vgs between the control end and the output end of the pull-down maintaining assembly of a typical GOA is greater than zero, namely the pull-down maintaining assembly is at an unstable turn-off status, which causes the current leakage of the output end Q(N) of the pull-up control assembly 100 and the current scanning line G(N). This is especially true when the current scanning line is active at high temperatures, the current leakage of thin film transistors (TFTs) is increased to further affect stability of the GOA. The present disclosure uses the pull-down maintaining signal LC having the low level, and the electric potential of the pull-down maintaining signal LC is less than the electric potential of the reference low-level signal VSS. When the current scanning line is inactive, the pull-down maintaining assembly 10 is controlled by the pull-down maintaining signal LC, and makes the reference low-level signal VSS be sent to the output end Q(N) of the pull-up control assembly 100 and the current scanning line G(N). Thus, the electric potentials of the output end Q(N) of the pull-up control assembly 100 and the current scanning line G(N) reduce, and residual electrons of the output end Q(N) of the pull-up control assembly 100 and the current scanning line G(N) are discharged. When the current scanning line is active, the pull-down maintaining signal LC outputs a low electric potential to the control end of the pull-down maintaining assembly, thus, the potential difference Vgs between the control end and the output end of the pull-down maintaining assembly is less than zero, namely the pull-down maintaining assembly is at a stable turn-off status, thereby reducing the current leakage of the output end Q(N) of the pull-up control assembly 100 and the current scanning line G(N), and improving stability of the GOA at high temperatures and improving long-term reliability of the GOA.

Example 1

Figure 2:
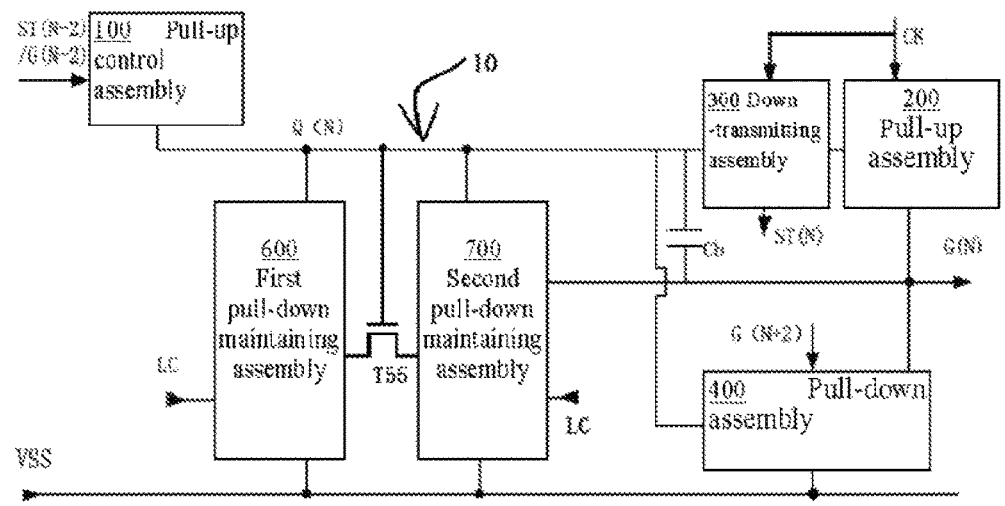
FIG. 2 is a schematic diagram of a scan driving circuit in a first example of the present disclosure.

FIG. 2 is a schematic diagram of a first example of the present disclosure. In FIGS. 1-2, the pull-down maintaining assembly 10 comprises a first pull-down maintaining assembly 600 and a second pull-down maintaining assembly 700. Input ends of the first pull-down maintaining assembly 600 and the second pull-down maintaining assembly 700 are coupled to the output end Q(N) of the pull-up control assembly 100, the pull-down maintaining signal LC is sent to control ends of the first pull-down maintaining assembly 600 and the second pull-down maintaining assembly 700, and the reference low-level signal VSS is sent to output ends of the first pull-down maintaining assembly 600 and the second pull-down maintaining assembly 700.

The scan driving circuit further comprises a diverter switch T55 connected between the control ends of the first pull-down maintaining assembly 600 and the second pull-down maintaining assembly 700, and a control end of the diverter switch T55 is coupled to the output end Q(N) of the pull-up control assembly 100.

When the current scanning line G(N) is active, the diverter switch T55 turns off the first pull-down maintaining assembly 600 and the second pull-down maintaining assembly 700, thus, the reference low-level signal VSS is not sent to the output end Q(N) of the pull-up control assembly 100 and the current scanning line G(N).

In the present disclosure, when the current scanning line G(N) is active, the diverter switch T55 turns off the first pull-down maintaining assembly 600 and the second pull-down maintaining assembly 700, which avoids failure of the GOA due to the low voltage of the output end Q(N) of the pull-up control assembly 100 that is caused by the first pull-down maintaining assembly 600 and the second pull-down maintaining assembly 700. When the current scanning line is inactive, one of the first pull-down maintaining assembly 600 and the second pull-down maintaining assembly 700 reduces the voltage of the output end Q(N) of the pull-up control assembly 100 to avoid current leakage. The first pull-down maintaining assembly 600 and the second pull-down maintaining assembly 700 alternately work, which avoids assembly failure due to long-term work of a single assembly.

Example 2

Figures 3, 4:
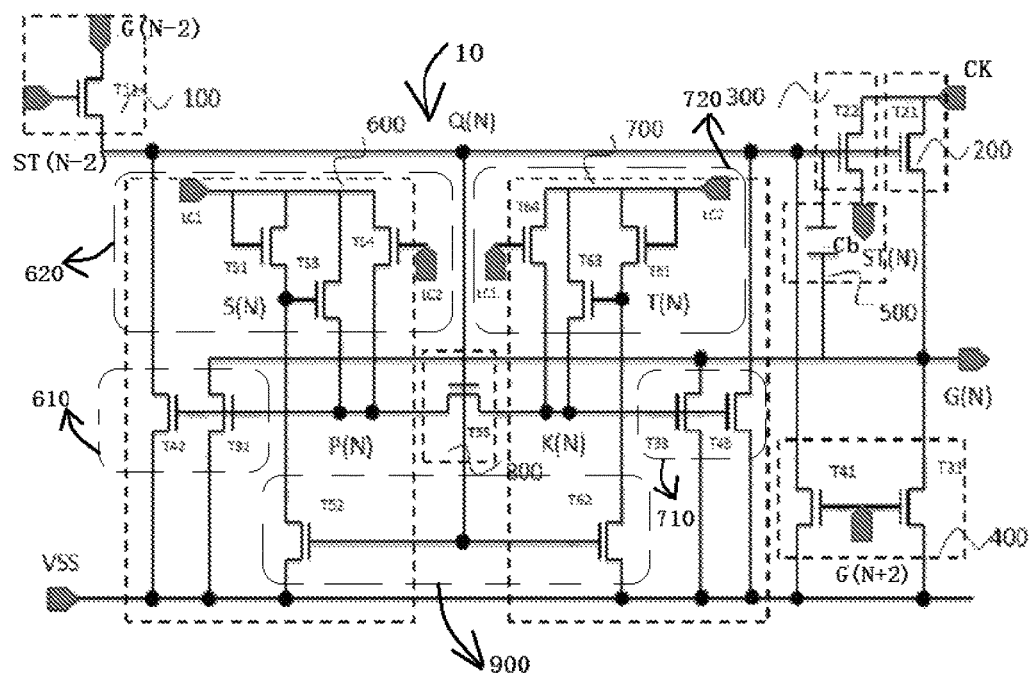
FIG. 3 is a schematic diagram of a scan driving circuit in a second example of the present disclosure.
FIG. 4 is a schematic diagram of a scan driving circuit in a third example of the present disclosure.

FIG. 3 is a schematic diagram of a second example of the present disclosure, combined with FIG. 1, FIG. 3 is an unfolded view of FIG. 1, the pull-down maintaining assembly 10 comprises the first pull-down maintaining assembly 600, the first pull-down maintaining assembly 600 comprises a first pull-down maintaining unit 610 and a first pull-down maintaining control unit 620, where the first pull-down maintaining control unit 620 drives the first pull-down maintaining unit 610. The first pull-down maintaining unit 610 comprises a first controllable switch T32 and a second controllable switch T42. The pull-down maintaining signal LC comprises a first pull-down maintaining signal LC1, and the first pull-down maintaining signal LC1 is sent to control ends of the first controllable switch T32 and the second controllable switch T42 via the first pull-down maintaining control unit 620. The reference low-level signal VSS is sent to the current scanning line G(N) via the first controllable switch T32, and is sent to the output end Q(N) of the pull-up control assembly 100 via the second controllable switch T42.

When the current scanning line G(N) is inactive, the first pull-down maintaining control unit 620 controls the first controllable switch T32 and the second controllable switch T42 to turn on according to the first pull-down maintaining signal LC1. The first controllable switch T32 controls the reference low-level signal VSS to be sent to the current scanning line G(N), and the second controllable switch T42 controls the reference low-level signal VSS to be sent to the output end Q(N) of the pull-up control assembly 100.

When the current scanning line G(N) is active, the first controllable switch T32 and the second controllable switch T42 turn off. The first controllable switch T32 controls the reference low-level signal VSS to be not sent to the current scanning line G(N), and the second controllable switch T42 controls the reference low-level signal VSS to be not sent to the output end Q(N) of the pull-up control assembly 100.

The first pull-down maintaining control unit 620 comprises a third controllable switch T51, a fourth controllable switch T53, and a fifth controllable switch T54. The pull-down maintaining signal LC further comprises a second pull-down maintaining signal LC2, where logical operation of the second pull-down maintaining signal LC2 is opposite to logical operation of the first pull-down maintaining signal LC1. The third controllable switch T51 uses a diode connection method, where the first pull-down maintaining signal LC1 is sent to an input end and a control end of the third controllable switch T51, and an output end of the third controllable switch T51 can be coupled to a control end of the fourth controllable switch T53 or the control ends of the first and second controllable switches (T32, T42). The control end of the fourth controllable switch T53 is coupled to the output end of the third controllable switch T51, the first and second pull-down maintaining signals (LC1, LC2) are sent to an input end of the fourth controllable switch T53, and an output end of the fourth controllable switch T53 is coupled to the control ends of the first and second controllable switches (T32, T42). The second pull-down maintaining signal LC2 is sent to a control end of the fifth controllable switch T54, the first pull-down maintaining signal LC1 is sent to an input end of the fifth controllable switch T54, and an output end of the fifth controllable switch T54 is coupled to the control ends of the first and second controllable switches (T32, T42).

The pull-down maintaining assembly 10 further comprises a turn-off unit 900, and the turn-off unit 900 comprises a sixth controllable switch T52. A control end of the sixth controllable switch T52 is coupled to the output end Q(N) of the pull-up control assembly 100, an input end of the sixth controllable switch T52 is coupled to the control end of the fourth controllable switch T53, and the reference low-level signal VSS or the second pull-down maintaining signal LC2 is sent to an output end of the sixth controllable switch T52.

The pull-down maintaining assembly 10 comprises the second pull-down maintaining assembly 700 comprising a second pull-down maintaining unit 710 and a second pull-down maintaining control unit 720, where the second pull-down maintaining control unit 720 drives the second pull-down maintaining unit 710. The pull-down maintaining signal LC comprises the second pull-down maintaining signal LC2, where the logical operation of the second pull-down maintaining signal LC2 is opposite to the logical operation of the first pull-down maintaining signal LC1. The second pull-down maintaining unit 710 comprises an eighth controllable switch T33 and a ninth controllable switch T43. The second pull-down maintaining signal LC2 is sent to control ends of the eighth and ninth controllable switches (T33, T43) via the second pull-down maintaining control unit 720. The reference low-level signal VSS is sent to the current scanning line G(N) via the eighth controllable switch T33, and is sent to the output end Q(N) of the pull-up control assembly 100 via the ninth controllable switch T43.

When the current scanning line G(N) is inactive, the first pull-down maintaining unit 610 and the second pull-down maintaining unit 710 alternately turn on. When the second pull-down maintaining unit 710 turn on, the eighth and ninth controllable switches (T33, T43) turn on, thus, the reference low-level signal VSS is sent to the output end Q(N) of the pull-up control assembly 100 and the current scanning line.

When the current scanning line G(N) is active, the first pull-down maintaining unit 610 and the second pull-down maintaining unit 710 turn off, and the first, second, eighth, and ninth controllable switches (T32, T42, T33, T43) turn off, thus, the reference low-level signal VSS is not sent to the output end Q(N) of the pull-up control assembly 100 and the current scanning line G(N). There are two pull-down maintaining assemblies, where the two pull-down maintaining assemblies work alternately to allow one of the two pull-down maintaining assemblies to be at a inactive status for half a work time. Thus, change of the electric potentials of the TFT at turn-on status and turn-off status due to long-time work of single pull-down maintaining assembly is avoided. This further avoids influence on turn-on of the pull-down maintaining assembly because of the change of the electric potentials of the TFT at turn-on status, and influence on turn-off of the pull-down maintaining assembly because of the change of the electric potentials of the TFT at turn-off status.

The pull-down maintaining assembly 10 comprises a balance bridge unit 800 comprising a diverter switch T55, a control end of the diverter switch T55 is coupled to the output end Q(N) of the pull-up control assembly 100, and the diverter switch T55 is connected between the control ends of the first and second controllable switches (T32, T42) and the control ends of the eighth and ninth controllable switches (T33, T43).

When the current scanning line G(N) is active, the diverter switch T55 turns on, thus, the first pull-down maintaining unit 610 is connected to the second pull-down maintaining unit 710, and electric potential of one of the control ends of the first and second pull-down maintaining units (610, 710), that is at high level, is reduced by electric potential of another control end that is at low level, thereby turning off the first and second pull-down maintaining units (610, 710). The diverter switch T55 is used to balance the electric potentials of two ends thereof. In the case of the sixth controllable switch T52 does not work, when the diverter switch T55 is on, the electric potential at point P(N) can be reduced to the electric potential at point K(N) via the diverter switch T55, which turns off the first, second, eighth, and ninth controllable switches (T32, T42, T33, T43). Thus, influence on the signals of the current scanning line G(N) and the output end Q(N) of the pull-up control assembly, that is caused because the TFTs do not turn off together, is avoided, and influence on the GOA circuit is further avoided.

The second pull-down maintaining control unit 720 comprises a tenth controllable switch T61, an eleventh controllable switch T63, and a twelfth controllable switch T64. The tenth controllable switch T61 uses the diode connection method, the first and second pull-down maintaining signals (LC1, LC2) are sent to an input end and a control end of the tenth controllable switch T61, and an output end of the tenth controllable switch T61 can be coupled to a control end of the eleventh controllable switch T63 or the control ends of the eighth and ninth controllable switches (T33, T43). The control end of the eleventh controllable switch T63 is coupled to the output end of the tenth controllable switch T61, the second pull-down maintaining signal LC2 is sent to an input end of the eleventh controllable switch T63, and an output end of the eleventh controllable switch T63 is coupled to the control ends of the eighth and ninth controllable switches (T33, T43). The first pull-down maintaining signal LC1 is sent to a control end of the twelfth controllable switch T64, the second pull-down maintaining signal LC2 is sent to an input end of the twelfth controllable switch T64, and an output end of the twelfth controllable switch T64 is coupled to the control ends of the eighth and ninth controllable switches (T33, T43).

When the current scanning line G(N) is inactive and the second pull-down maintaining assembly 700 turns on, the tenth, eleventh, and twelfth controllable switches (T61, T63, T64) control the eighth and ninth controllable switches (T33, T43) to turn on according to the first and second pull-down maintaining signals (LC1, LC2), thus, the reference low-level signal VSS is sent to the output end Q(N) of the pull-up control assembly 100 and the current scanning line G(N).

The turn-off unit 900 comprises a thirteenth controllable switch T62. A control end of the thirteenth controllable switch T62 is coupled to the output end Q(N) of the pull-up control assembly 100, an input end of the thirteenth controllable switch T62 is coupled to the control end of the eleventh controllable switch T63, and the reference low-level signal VSS or the first pull-down maintaining signal LC1 is sent to an output end of the thirteenth controllable switch T62. When the current scanning line G(N) is active, the sixth and thirteenth controllable switches (T52, T62) assist in reducing the electric potential at point S(N) of the control end of the fourth controllable switch T53 and the electric potential at point T(N) of the control end of the eleventh controllable switch T63, which can reduce the electric potential at point P(N) of the control ends of the first and second controllable switches (T32, T42) and the electric potential at point K(N) of the control ends of the eighth and ninth controllable switches (T33, T43). Thus, the pull-down maintaining assembly turns off, and the influence on the GOA due to the pull-down maintaining assembly is avoided. Because electric potential of the first pull-down maintaining signal LC1 is less than electric potential of the first reference low-level signal, potential difference between the control end and output end of the first controllable switch T32, potential difference between the control end and output end of the second controllable switch T42, potential difference between the control end and output end of the eighth controllable switch T33, and potential difference Vgs between the control end and output end of the ninth controllable switch T43 are less than zero, thereby avoiding current leakage.

The first pull-down maintaining signal LC1 and the second pull-down maintaining signal LC2 are not only at the low level, that is less than the electric potential of the reference low-level signal VSS, but also are low-frequency signals. Time of switching the first and second pull-down maintaining signals (LC1, LC2) is a blanking time between each frame image.

The pull-up control assembly 100 comprises a seventeenth controllable switch T11, and an output end of the seventeenth controllable switch T11 is coupled to the control end of the pull-up assembly 200. The pull-up control signal comprises the previous scanning line G(N−2) and the previous down-transmitting signal ST(N−2), the previous down-transmitting signal ST(N−2) is sent to a control end of the seventeenth controllable switch T11, and an input end of the seventeenth controllable switch T11 is coupled to the previous scanning line G(N−2). The pull-up assembly 200 comprises an eighteenth controllable switch T21, a control end of the eighteenth controllable switch T21 is coupled to the output end Q(N) of the pull-up control assembly 100, the clock scanning signal CK is sent to an input end of the eighteenth controllable switch T21, and an output end of the eighteenth controllable switch T21 is coupled to the current scanning line G(N). The scan driving circuit further comprises a storage capacitor Cb, a first end of the storage capacitor Cb is coupled to the output end Q(N) of the pull-up control assembly 100, and a second end of the storage capacitor Cb is coupled to the output end of the pull-up assembly 200.

The pull-down assembly 400 comprises a twentieth controllable switch T31 and a twenty-first controllable switch T41, and control ends of the twentieth controllable switch T31 and the twenty-first controllable switch T41 are coupled to the next scanning line G(N+2). An input end of the twentieth controllable switch T31 is coupled to the current scanning line G(N), and the reference low-level signal VSS is sent to an output end of the twentieth controllable switch T31. An input end of the twenty-first controllable switch T41 is coupled to the output end of the pull-up control assembly 100, and the reference low-level signal is sent to an output end of the twenty-first controllable switch T41.

It should be understood that, in the present disclosure, only one pull-down maintaining assembly used can reduce the current leakage.

Example 3

FIG. 4 is a schematic diagram of a third example of the present disclosure, and is an detailed view of FIG. 1, the reference low-level signal VSS comprises a first reference low-level signal VSS1 and a second reference low-level signal VSS2, where electric potential of the second reference low-level signal VSS2 is less than electric potential of the first reference low-level signal and greater than electric potential of the pull-down maintaining signal. The pull-down maintaining assembly 10 comprises the first pull-down maintaining assembly 600 comprising the first pull-down maintaining unit 610 and the first pull-down maintaining control unit 620, where the first pull-down maintaining control unit 620 drives the first pull-down maintaining unit 610. The first pull-down maintaining unit 610 comprises the first controllable switch T32 and the second controllable switch T42. The pull-down maintaining signal LC comprises the first pull-down maintaining signal LC1, and the first pull-down maintaining signal LC1 is sent to control ends of the first controllable switch T32 and the second controllable switch T42 via the first pull-down maintaining control unit 620. The first reference low-level signal VSS1 is sent to the current scanning line G(N) via the first controllable switch T32, and the second reference low-level signal VSS2 is sent to the output end Q(N) of the pull-up control assembly 100 via the second controllable switch T42.

When the current scanning line G(N) is inactive, the first pull-down maintaining control unit 620 controls the first controllable switch T32 and the second controllable switch T42 to turn on according to the first pull-down maintaining signal LC1. The first controllable switch T32 controls the first reference low-level signal VSS1 to be sent to the current scanning line G(N), and the second controllable switch T42 controls the second reference low-level signal VSS2 to be sent to the output end Q(N) of the pull-up control assembly 100.

When the current scanning line G(N) is active, the first controllable switch T32 and the second controllable switch T42 turn off. The first controllable switch T32 controls the first reference low-level signal VSS1 to be not sent to the current scanning line G(N), and the second controllable switch T42 controls the second reference low-level signal VSS2 to be not sent to the output end Q(N) of the pull-up control assembly 100.

The first pull-down maintaining control unit 620 comprises the third controllable switch T51, the fourth controllable switch T53, and the fifth controllable switch T54. The pull-down maintaining signal LC further comprises the second pull-down maintaining signal LC2, where the logical operation of the second pull-down maintaining signal LC2 is opposite to the logical operation of the first pull-down maintaining signal LC1. The third controllable switch T51 uses the diode connection method, the first pull-down maintaining signal LC1 is sent to the input end and the control end of the third controllable switch T51, and the output end of the third controllable switch T51 can be coupled to the control end of the fourth controllable switch T53. The control end of the fourth controllable switch T53 is coupled to the output end of the third controllable switch T51, the first and second pull-down maintaining signals (LC1, LC2) are sent to the input end of the fourth controllable switch T53, and the output end of the fourth controllable switch T53 is coupled to the control ends of the first and second controllable switches (T32, T42). The second pull-down maintaining signal LC2 is sent to the control end of the fifth controllable switch T54, the first pull-down maintaining signal LC1 is sent to the input end of the fifth controllable switch T54, and the output end of the fifth controllable switch T54 is coupled to the control ends of the first and second controllable switches (T32, T42).

The pull-down maintaining assembly 10 further comprises the turn-off unit 900, and the turn-off unit 900 comprises the sixth controllable switch T52. The control end of the sixth controllable switch T52 is coupled to the output end Q(N) of the pull-up control assembly 100, the input end of the sixth controllable switch T52 is coupled to the control end of the fourth controllable switch T53, and the second reference low-level signal VSS2 or the second pull-down maintaining signal LC2 is sent to the output end of the sixth controllable switch T52.

The pull-down maintaining assembly 10 comprises the second pull-down maintaining assembly 700 comprising the second pull-down maintaining unit 710 and the second pull-down maintaining control unit 720, where the second pull-down maintaining control unit 720 drives the second pull-down maintaining unit 710. The pull-down maintaining signal LC comprises the second pull-down maintaining signal LC2, where the logical operation of the second pull-down maintaining signal LC2 is opposite to the logical operation of the first pull-down maintaining signal LC1. The second pull-down maintaining unit 710 comprises the eighth controllable switch T33 and the ninth controllable switch T43. The second pull-down maintaining signal LC2 is sent to control ends of the eighth and ninth controllable switches (T33, T43) via the second pull-down maintaining control unit 720. The first reference low-level signal VSS1 is sent to the current scanning line G(N) via the eighth controllable switch T33, and the second reference low-level signal VSS2 is sent to the output end Q(N) of the pull-up control assembly 100 via the ninth controllable switch T43.

When the current scanning line G(N) is inactive, the first pull-down maintaining unit 610 and the second pull-down maintaining unit 710 alternately turn on. When the second pull-down maintaining unit 710 turns on, the eighth and ninth controllable switches (T33, T43) turn on, thus, the second reference low-level signal VSS2 is sent to the output end Q(N) of the pull-up control assembly 100, and the first reference low-level signal VSS1 is sent to the current scanning line.

When the current scanning line G(N) is active, the first pull-down maintaining unit 610 and the second pull-down maintaining unit 710 turn off, and the first, second, eighth, and ninth controllable switches (T32, T42, T33, T43) turn off, thus, the second reference low-level signal VSS2 is not sent to the output end Q(N) of the pull-up control assembly 100, and the first reference low-level signal VSS1 is not sent to the current scanning line G(N). There are two pull-down maintaining assemblies, where the two pull-down maintaining assemblies work alternately allow one of the two pull-down maintaining assemblies to be at the inactive status for the half work time, thus, change of the electric potentials of the TFT at turn-on status and turn-off status because of long-time work of single pull-down maintaining assembly is avoided, and further avoiding influence on turn-on of the pull-down maintaining assembly because of the change of the electric potentials of the TFT at turn-on status, and influence on turn-off of the pull-down maintaining assembly because of the change of the electric potentials of the TFT at turn-off status.

The pull-down maintaining assembly 10 further comprises the balance bridge unit 800 comprising the diverter switch T55, the control end of the diverter switch T55 is coupled to the output end Q(N) of the pull-up control assembly 100, and the diverter switch T55 is connected between the control ends of the first and second controllable switches (T32, T42) and the control ends of the eighth and ninth controllable switches (T33, T43). The diverter switch T55 is used to balance the electric potentials of two ends thereof. In the case of the sixth controllable switch T52 is wrong, when the diverter switch T55 is on, the electric potential at point P(N) can be reduced to the electric potential at point K(N) via the diverter switch T55, which turns off the first, second, eighth, and ninth controllable switches (T32, T42, T33, T43). Thus, influence on the signals of the G(N) and the Q(N), that is caused because the TFTs do not turn off together, is avoided, and influence on the GOA circuit is further avoided.

When the current scanning line G(N) is active, the diverter switch T55 turns on, thus, the first pull-down maintaining unit 610 is connected to the second pull-down maintaining unit 710, and electric potential of one of the control ends of the first and second pull-down maintaining units (610, 710), that is at high level, is reduced by electric potential of another control end that is at low level, thereby turning off the first and second pull-down maintaining units (610, 710).

The second pull-down maintaining control unit 720 comprises the tenth controllable switch T61, the eleventh controllable switch T63, and the twelfth controllable switch T64. The connection method of the tenth controllable switch T61 is the diode connection method, the second pull-down maintaining signal LC2 is sent to the input end and the control end of the tenth controllable switch T61, and the output end of the tenth controllable switch T61 is coupled to the control end of the eleventh controllable switch T63. The control end of the eleventh controllable switch T63 is coupled to the output end of the tenth controllable switch T61, the first and second pull-down maintaining signals (LC1, LC2) are sent to the input end of the eleventh controllable switch T63, and the output end of the eleventh controllable switch T63 is coupled to the control ends of the eighth and ninth controllable switches (T33, T43). The first pull-down maintaining signal LC1 is sent to the control end of the twelfth controllable switch T64, the second pull-down maintaining signal LC2 is sent to the input end of the twelfth controllable switch T64, and the output end of the twelfth controllable switch T64 is coupled to the control ends of the eighth and ninth controllable switches (T33, T43).

When the current scanning line G(N) is inactive and the second pull-down maintaining assembly 700 turns on, the tenth, eleventh, and twelfth controllable switches (T61, T63, T64) control the eighth and ninth controllable switches (T33, T43) to turn on according to the first and second pull-down maintaining signals (LC1, LC2), thus, the second reference low-level signal VSS2 is sent to the output end Q(N) of the pull-up control assembly 100, and the first reference low-level signal VSS1 is sent to the current scanning line.

The turn-off unit 900 comprises the thirteenth controllable switch T62. The control end of the thirteenth controllable switch T62 is coupled to the output end Q(N) of the pull-up control assembly 100, the input end of the thirteenth controllable switch T62 is coupled to the control end of the eleventh controllable switch T63, and the second reference low-level signal VSS2 or the first pull-down maintaining signal LC1 is sent to the output end of the thirteenth controllable switch T62. When the current scanning line G(N) is active, the sixth and thirteenth controllable switches (T52, T62) assist in reducing the electric potential at point S(N) of the control end of the fourth controllable switch T53 and the electric potential at point T(N) of the control end of the eleventh controllable switch T63, which can reduce the electric potential at point P(N) of the control ends of the first and second controllable switches (T32, T42) and the electric potential at point K(N) of the control ends of the eighth and ninth controllable switches (T33, T43). Thus, the pull-down maintaining assembly turns off, and the influence on the GOA due to the pull-down maintaining assembly is avoided. Because electric potentials of the second reference low-level signal VSS2 and the first pull-down maintaining signal LC1 is less than electric potential of the first reference low-level signal, potential difference between the control end and output end of the first controllable switch T32, potential difference between the control end and output end of the second controllable switch T42, potential difference between the control end and output end of the eighth controllable switch T33, and potential difference between the control end and output end of the ninth controllable switch T43 are less than zero, namely the first, second, eighth, and ninth controllable switches are at good turn-off status, thereby avoiding current leakage.

The first pull-down maintaining signal LC1 and the second pull-down maintaining signal LC2 are not only at the low level, that is less than the electric potential of the reference low-level signal VSS, but also are low-frequency signals. Time of switching the first and second pull-down maintaining signals (LC1, LC2) is the blanking time between each frame image.

The pull-up control assembly 100 comprises the seventeenth controllable switch T11, the output end of the seventeenth controllable switch T11 is coupled to the control end of the pull-up assembly 200, the previous down-transmitting signal ST(N−2) is sent to the control end of the seventeenth controllable switch T11, and the input end of the seventeenth controllable switch T11 is coupled to the previous scanning line G(N−2). The pull-up assembly 200 comprises the eighteenth controllable switch T21, the control end of the eighteenth controllable switch T21 is coupled to the output end Q(N) of the pull-up control assembly 100, the clock scanning signal CK is sent to the input end of the eighteenth controllable switch T21, and the output end of the eighteenth controllable switch T21 is coupled to the current scanning line G(N). The scan driving circuit further comprises the storage capacitor Cb, where a first end of the storage capacitor Cb is coupled to the output end Q(N) of the pull-up control assembly 100, and a second end of the storage capacitor Cb is coupled to the output end of the pull-up assembly 200.

The first pull-down maintaining signal LC1 and the second pull-down maintaining signal LC2 are low-frequency signals. Time of switching the first and second pull-down maintaining signals (LC1, LC2) is the blanking time between each frame image.

The pull-down assembly 400 comprises the twentieth controllable switch T31 and the twenty-first controllable switch T41, and control ends of the twentieth controllable switch T31 and the twenty-first controllable switch T41 are coupled to the next scanning line G(N+2). The input end of the twentieth controllable switch T31 is coupled to the current scanning line G(N), and the first reference low-level signal VSS1 is sent to the output end of the twentieth controllable switch T31. The input end of the twenty-first controllable switch T41 is coupled to the output end of the pull-up control assembly 100, and the second reference low-level signal VSS2 is sent to the output end of the twenty-first controllable switch T41.

The scan driving circuit further comprises a down-transmitting assembly 300, a control end of the down-transmitting assembly 300 is coupled to the output end Q(N) of the pull-up control assembly 100 and the control end of the pull-up assembly 200, the clock scanning signal CK is sent to an input end of the down-transmitting assembly 300, and an output end of the down-transmitting assembly 300 outputs a current down-transmitting signal ST(N).

The down-transmitting assembly 300 comprises a nineteenth controllable switch T22, a control end of the nineteenth controllable switch T22 is coupled to the output end Q(N) of the pull-up control assembly 100 and the control end of the pull-up assembly 200, the clock scanning signal CK is sent to an input end of the nineteenth controllable switch T22, and an output end of the nineteenth controllable switch T22 outputs the current down-transmitting signal ST(N). If the signal of the G(N) simultaneity drives the current scanning line and the next GOA, the signal is not steady, thereby affecting the output of the GOA circuit. And when the signal of the G(N) is wrong, entire GOA circuit is affected. In the present disclosure, the down-transmitting assembly 300 is used to drive the next GOA, thus, the entire GOA circuit is not affected when the signal of the G(N) is wrong.

It should be understood that, in the present disclosure, only one pull-down maintaining assembly used can reduce the current leakage.

Example 4

Figure 5:
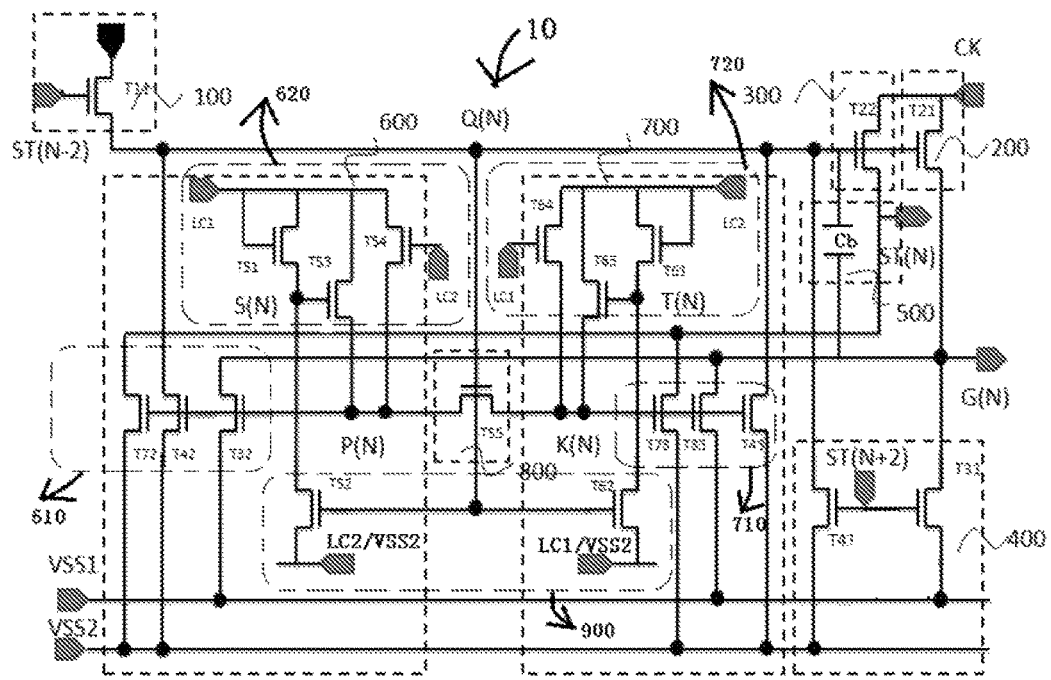
FIG. 5 is a schematic diagram of a scan driving circuit in a fourth example of the present disclosure.

FIG. 5 is a schematic diagram of a fourth example of the present disclosure, and is an unfolded view of FIG. 1, the reference low-level signal VSS comprises the first reference low-level signal VSS1 and the second reference low-level signal VSS2, where the electric potential of the second reference low-level signal VSS2 is less than the electric potential of the first reference low-level signal and greater than the electric potential of the pull-down maintaining signal LC. The pull-down maintaining assembly 10 comprises the first pull-down maintaining assembly 600 comprising the first pull-down maintaining unit 610 and the first pull-down maintaining control unit 620, where the first pull-down maintaining control unit 620 drives the first pull-down maintaining unit 610. The first pull-down maintaining unit 610 comprises the first controllable switch T32 and the second controllable switch T42. The pull-down maintaining signal LC comprises the first pull-down maintaining signal LC1, and the first pull-down maintaining signal LC1 is sent to control ends of the first controllable switch T32 and the second controllable switch T42 via the first pull-down maintaining control unit 620. The first reference low-level signal VSS1 is sent to the current scanning line G(N) via the first controllable switch T32, and the second reference low-level signal VSS2 is sent to the output end Q(N) of the pull-up control assembly 100 via the second controllable switch T42.

When the current scanning line G(N) is inactive, the first pull-down maintaining control unit 610 controls the first controllable switch T32 and the second controllable switch T42 to turn on according to the first pull-down maintaining signal LC1. The first controllable switch T32 controls the first reference low-level signal VSS1 to be sent to the current scanning line G(N), and the second controllable switch T42 controls the second reference low-level signal VSS2 to be sent to the output end Q(N) of the pull-up control assembly 100.

When the current scanning line G(N) is active, the first controllable switch T32 and the second controllable switch T42 turn off. The first controllable switch T32 controls the first reference low-level signal VSS1 to be not sent to the current scanning line G(N), and the second controllable switch T42 controls the second reference low-level signal VSS2 to be not sent to the output end Q(N) of the pull-up control assembly 100.

The first pull-down maintaining control unit 620 comprises the third controllable switch T51, the fourth controllable switch T53, and the fifth controllable switch T54. The pull-down maintaining signal LC further comprises the second pull-down maintaining signal LC2, where the logical operation of the second pull-down maintaining signal LC2 is opposite to the logical operation of the first pull-down maintaining signal LC1. The third controllable switch T51 uses the diode connection method, the first pull-down maintaining signal LC1 is sent to the input end and the control end of the third controllable switch T51, and the output end of the third controllable switch T51 is coupled to the control end of the fourth controllable switch T53. The control end of the fourth controllable switch T53 is coupled to the output end of the third controllable switch T51, the first pull-down maintaining signals LC1 is sent to the input end of the fourth controllable switch T53, and the output end of the fourth controllable switch T53 is coupled to the control ends of the first and second controllable switches (T32, T42). The second pull-down maintaining signal LC2 is sent to the control end of the fifth controllable switch T54, the first pull-down maintaining signal LC1 is sent to the input end of the fifth controllable switch T54, and the output end of the fifth controllable switch T54 is coupled to the control ends of the first and second controllable switches (T32, T42).

The pull-down maintaining assembly 10 further comprises the turn-off unit 900, and the turn-off unit 900 comprises the sixth controllable switch T52. The control end of the sixth controllable switch T52 is coupled to the output end Q(N) of the pull-up control assembly 100, the input end of the sixth controllable switch T52 is coupled to the control end of the fourth controllable switch T53, and the second reference low-level signal VSS2 or the second pull-down maintaining signal LC2 is sent to the output end of the sixth controllable switch T52.

The pull-down maintaining assembly 10 comprises the second pull-down maintaining assembly 700 comprising the second pull-down maintaining unit 710 and the second pull-down maintaining control unit 720, where the second pull-down maintaining control unit 720 drives the second pull-down maintaining unit 710. The pull-down maintaining signal LC comprises the second pull-down maintaining signal LC2, where the logical operation of the second pull-down maintaining signal LC2 is opposite to the logical operation of the first pull-down maintaining signal LC1. The second pull-down maintaining unit 710 comprises the eighth controllable switch T33 and the ninth controllable switch T43. The second pull-down maintaining signal LC2 is sent to control ends of the eighth and ninth controllable switches (T33, T43) via the second pull-down maintaining control unit 720. The first reference low-level signal VSS1 is sent to the current scanning line G(N) via the eighth controllable switch T33, and the second reference low-level signal VSS2 is sent to the output end Q(N) of the pull-up control assembly 100 via the ninth controllable switch T43.

When the current scanning line G(N) is inactive, the first pull-down maintaining unit 610 and the second pull-down maintaining unit 710 alternately turn on. When the second pull-down maintaining unit 710 turns on, the eighth and ninth controllable switches (T33, T43) turn on, thus, the second reference low-level signal VSS2 is sent to the output end Q(N) of the pull-up control assembly 100, and the first reference low-level signal VSS1 is sent to the current scanning line.

When the current scanning line G(N) is active, the first pull-down maintaining unit 610 and the second pull-down maintaining unit 710 turn off, and the first, second, eighth, and ninth controllable switches (T32, T42, T33, T43) turn off, thus, the second reference low-level signal VSS2 is not sent to the output end Q(N) of the pull-up control assembly 100, and the first reference low-level signal VSS1 is not sent to the current scanning line G(N). There are pull-down maintaining assemblies, where the two pull-down maintaining assemblies work alternately, to allow one of the two pull-down maintaining assemblies to be at the inactive status for the half work time, thus, change of the electric potentials of the TFT at turn-on status and turn-off status because of long-time work of single pull-down maintaining assembly is avoided, and further avoiding influence on turn-on of the pull-down maintaining assembly because of the change of the electric potentials of the TFT at turn-on status, and influence on turn-off of the pull-down maintaining assembly because of the change of the electric potentials of the TFT at turn-off status.

The second pull-down maintaining control unit 720 comprises the tenth controllable switch T61, the eleventh controllable switch T63, and the twelfth controllable switch T64. The connection method of the tenth controllable switch T61 is the diode connection method, the second pull-down maintaining signal LC2 is sent to the input end and the control end of the tenth controllable switch T61, and the output end of the tenth controllable switch T61 is coupled to the control end of the eleventh controllable switch T63. The control end of the eleventh controllable switch T63 is coupled to the output end of the tenth controllable switch T61, the second pull-down maintaining signals LC2 is sent to the input end of the eleventh controllable switch T63, and the output end of the eleventh controllable switch T63 is coupled to the control ends of the eighth and ninth controllable switches (T33, T43). The first pull-down maintaining signal LC1 is sent to the control end of the twelfth controllable switch T64, the second LC2 is sent to the input end of the twelfth controllable switch T64, and the output end of the twelfth controllable switch T64 is coupled to the control ends of the eighth and ninth controllable switches (T33, T43).

When the current scanning line G(N) is inactive and the second pull-down maintaining assembly 700 turns on, the tenth, eleventh, and twelfth controllable switches (T61, T63, T64) control the eighth and ninth controllable switches (T33, T43) to turn on according to the first and second pull-down maintaining signals (LC1, LC2), thus, the second reference low-level signal VSS2 is sent to the output end Q(N) of the pull-up control assembly 100, and the first reference low-level signal VSS1 is sent to the current scanning line.

The pull-down maintaining assembly 10 comprises a balance bridge unit 800 comprising a diverter switch T55, a control end of the diverter switch T55 is coupled to the output end Q(N) of the pull-up control assembly 100, and the diverter switch T55 is connected between the control ends of the first and second controllable switches (T32, T42) and the control ends of the eighth and ninth controllable switches (T33, T43).

When the current scanning line G(N) is active, the diverter switch T55 turns on, thus, the first pull-down maintaining unit 610 is connected to the second pull-down maintaining unit 710, and electric potential of one of the control ends of the first and second pull-down maintaining units (610, 710), that is at high level, is reduced by electric potential of another control end that is at low level, thereby turning off the first and second pull-down maintaining units (610, 710). The diverter switch T55 is used to balance the electric potentials of two ends thereof. Especially the sixth controllable switch T52 and the thirteenth controllable switch T62 do not work, when the diverter switch T55 is on, the electric potential at point P(N) can be reduced to the electric potential at point K(N) via the diverter switch T55, which turns off the first, second, eighth, and ninth controllable switches (T32, T42, T33, T43). Thus, influence on the signals of the G(N) and the Q(N), that is caused because the TFTs do not turn off together, is avoided, and influence on the GOA circuit is further avoided.

The turn-off unit 900 comprises the thirteenth controllable switch T62. The control end of the thirteenth controllable switch T62 is coupled to the output end Q(N) of the pull-up control assembly 100, the input end of the thirteenth controllable switch T62 is coupled to the control end of the eleventh controllable switch T63, and the second reference low-level signal VSS2 or the first pull-down maintaining signal LC1 is sent to the output end of the thirteenth controllable switch T62. When the current scanning line G(N) is active, the sixth and thirteenth controllable switches (T52, T62) assist in reducing the electric potential at point S(N) of the control end of the fourth controllable switch T53 and the electric potential at point T(N) of the control end of the eleventh controllable switch T63, which can reduce the electric potential at point P(N) of the control ends of the first and second controllable switches (T32, T42) and the electric potential at point K(N) of the control ends of the eighth and ninth controllable switches (T33, T43). Thus, the pull-down maintaining assembly turns off, and the influence on the GOA due to the pull-down maintaining assembly is avoided. Because electric potentials of the second reference low-level signal VSS2 and the first pull-down maintaining signal LC1 are less than electric potential of the first reference low-level signal, potential difference between the control end and output end of the first controllable switch, potential difference between the control end and output end of the second controllable switch, potential difference between the control end and output end of the eighth controllable switch, and potential difference between the control end and output end of the ninth controllable switch are less than zero, namely the first, second, eighth, and ninth controllable switches are at good turn-off status, thereby avoiding current leakage.

The first pull-down maintaining signal LC1 and the second pull-down maintaining signal LC2 are not only at the low level, that is less than the electric potential of the reference low-level signal VSS, but also are low-frequency signals. Time of switching the first and second pull-down maintaining signals (LC1, LC2) is the blanking time between each frame image.

The pull-up control assembly 100 comprises the seventeenth controllable switch T11, and the output end of the seventeenth controllable switch T11 is coupled to the control end of the pull-up assembly 200. The pull-up control signal comprises the previous scanning line G(N–2) and the previous down-transmitting signal ST(N–2), the previous down-transmitting signal ST(N–2) is sent to the control end of the seventeenth controllable switch T11, and the input end of the seventeenth controllable switch T11 is coupled to the previous scanning line G(N–2). The pull-up assembly 200 comprises the eighteenth controllable switch T21, the control end of the eighteenth controllable switch T21 is coupled to the output end Q(N) of the pull-up control assembly 100, the clock scanning signal CK is sent to the input end of the eighteenth controllable switch T21, and the output end of the eighteenth controllable switch T21 is coupled to the current scanning line G(N). The scan driving circuit further comprises the storage capacitor Cb, the first end of the storage capacitor Cb is coupled to the output end Q(N) of the pull-up control assembly 100, and the second end of the storage capacitor Cb is coupled to the output end of the pull-up assembly 200.

The scan driving circuit further comprises a down-transmitting assembly 300, a control end of the down-transmitting assembly 300 is coupled to the output end Q(N) of the pull-up control assembly 100 and the control end of the pull-up assembly 200, the clock scanning signal CK is sent to an input end of the down-transmitting assembly 300, and an output end of the down-transmitting assembly 300 outputs a current down-transmitting signal ST(N).

The down-transmitting assembly 300 comprises the nineteenth controllable switch T22, the control end of the nineteenth controllable switch T22 is coupled to the output end Q(N) of the pull-up control assembly 100 and the control end of the pull-up assembly 200, the clock scanning signal CK is sent to the input end of the nineteenth controllable switch T22, and the output end of the nineteenth controllable switch T22 outputs the current down-transmitting signal ST(N). If the signal of the G(N) simultaneity drives the current scanning line and the next GOA, the signal is not steady, thereby affecting the output of the GOA circuit. And when the signal of the G(N) is wrong, entire GOA circuit is affected. In the present disclosure, the down-transmitting assembly 300 is used to drive the next GOA, thus, the entire GOA circuit is not affected when the signal of the G(N) is wrong.

The first pull-down maintaining unit 610 further comprises a seventh controllable switch T72, and the second pull-down maintaining unit 710 comprises the fourteenth controllable switch T73. A control end of the seventh controllable switch T72 is coupled to the control ends of the first and second controllable switches (T32, T42), an input end of the seventh controllable switch T72 is coupled to the output end of the nineteenth controllable switch T22, and the second reference low-level signal VSS2 is sent to an output end of the seventh controllable switch T72. A control end of the fourteenth controllable switch T73 is coupled to the control ends of the eighth and ninth controllable switches (T33, T43), an input end of the fourteenth controllable switch T73 is coupled to the output end of the nineteenth controllable switch T22, and the second reference low-level signal VSS2 is sent to an output end of the fourteenth controllable switch T73.

In the present disclosure, the seventh and fourteenth controllable switches (T72, T73) are arranged after the down-transmitting assembly 300 is arranged, the reason of using the seventh and fourteenth controllable switches (T72, T73) is following: the signal generated at the output end of the down-transmitting assembly fluctuates because of some factors, e.g., a parasitic capacitor. If electrons in the parasitic capacitor cannot be completely discharged when the current scanning line is inactive, an unsteady down-transmitting signal that is generated when the current scanning line is active, which can affect the next GOA circuit. After the seventh and fourteenth controllable switches (T72, T73) are arranged, the seventh and fourteenth controllable switches (T72, T73) can discharge remaining electrons of the output end of the down-transmitting assembly in time through the reference low-level signal when the current scanning line is active, which ensures the stability of the down-transmitting signal, thereby improving work capability of the next scanning line.

The first pull-down maintaining signal LC1 and the second pull-down maintaining signal LC2 are the low-frequency signals. Time of switching the first and second pull-down maintaining signals (LC1, LC2) is the blanking time between each frame image.

The pull-down assembly 400 comprises the twentieth controllable switch T31 and the twenty-first controllable switch T41, and control ends of the twentieth controllable switch T31 and the twenty-first controllable switch T41 are coupled to the next scanning line G(N+2). The input end of the twentieth controllable switch T31 is coupled to the current scanning line G(N), and the first reference low-level signal VSS1 is sent to the output end of the twentieth controllable switch T31. The input end of the twenty-first controllable switch T41 is coupled to the output end of the pull-up control assembly 100, and the second reference low-level signal VSS2 is sent to the output end of the twenty-first controllable switch T41.

It should be understood that, in the present disclosure, only one pull-down maintaining assembly used can reduce the current leakage.

Example 5

FIG. 6 to FIG. 9 are schematic diagrams of a fifth example of the present disclosure.

Figure 6:
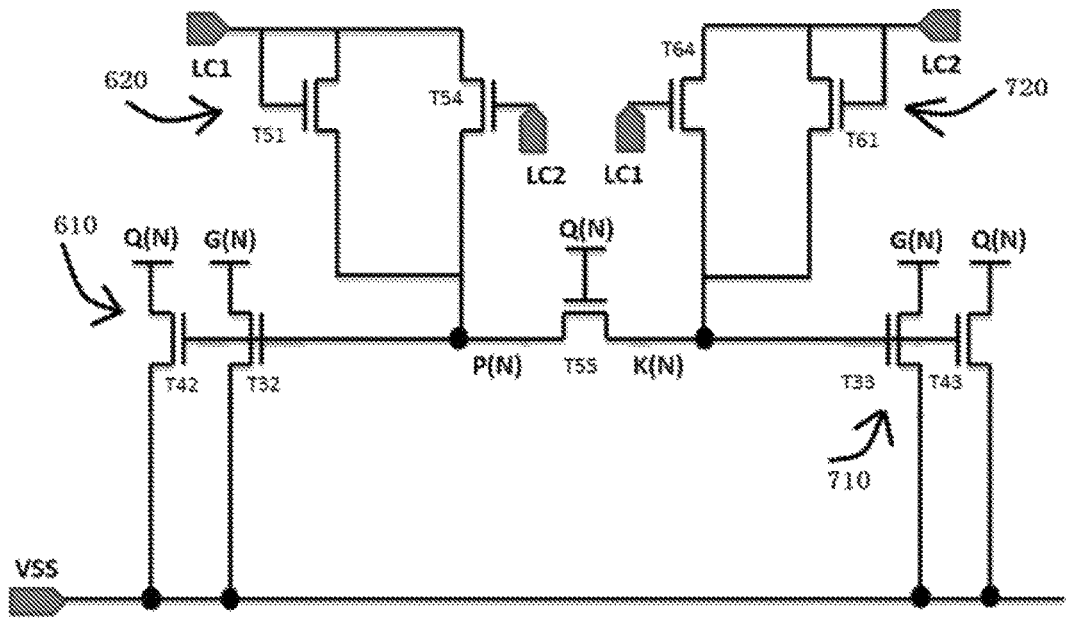
FIG. 6 is a first schematic diagram of a scan driving circuit in a fifth example of the present disclosure.

FIG. 6 is a first schematic diagram of the fifth example of the present disclosure, where the pull-down maintaining assembly 10 is different between the fifth example and the second and third examples. In the example, the pull-down maintaining control unit 620 comprises the third controllable switch T51 and the fifth controllable switch T54, and the second pull-down maintaining control unit 720 comprises the tenth controllable switch T61 and the twelfth controllable switch T64. The third controllable switch T51 and the tenth controllable switch T61 use the diode connection method, namely the control end and the input end of the third controllable switch T51 are coupled to the first pull-down maintaining signal LC1, and the control end and the input end of the tenth controllable switch T61 are coupled to the second pull-down maintaining signal LC2. The output end of the third controllable switch T51 is coupled to point P(N) of the control ends of the first and second controllable switches (T32, T42), and the output end of the tenth controllable switch T61 is coupled to point K(N) of the control ends of the eighth and ninth controllable switches (T33, T43).

The pull-down maintaining assembly 10 further comprises the balance bridge unit 800 comprising the diverter switch T55, the control end of the diverter switch T55 is coupled to the output end Q(N) of the pull-up control assembly 100, and the diverter switch T55 is connected between point P(N) of the control ends of the first and second controllable switches (T32, T42) and point K(N) of the control ends of the eighth and ninth controllable switches (T33, T43). The diverter switch T55 is used to balance the electric potentials of two ends thereof. Especially the sixth controllable switch T52 and the thirteenth controllable switch T62 do not work, when the diverter switch T55 is on, the electric potential at point P(N) can be reduced to the electric potential at point K(N) via the diverter switch T55, which turns off the first, second, eighth, and ninth controllable switches (T32, T42, T33, T43). Thus, influence on the signals of the G(N) and the Q(N), that is caused because the TFTs do not turn off together, is avoided, and influence on the GOA circuit is further avoided.

Figure 7:
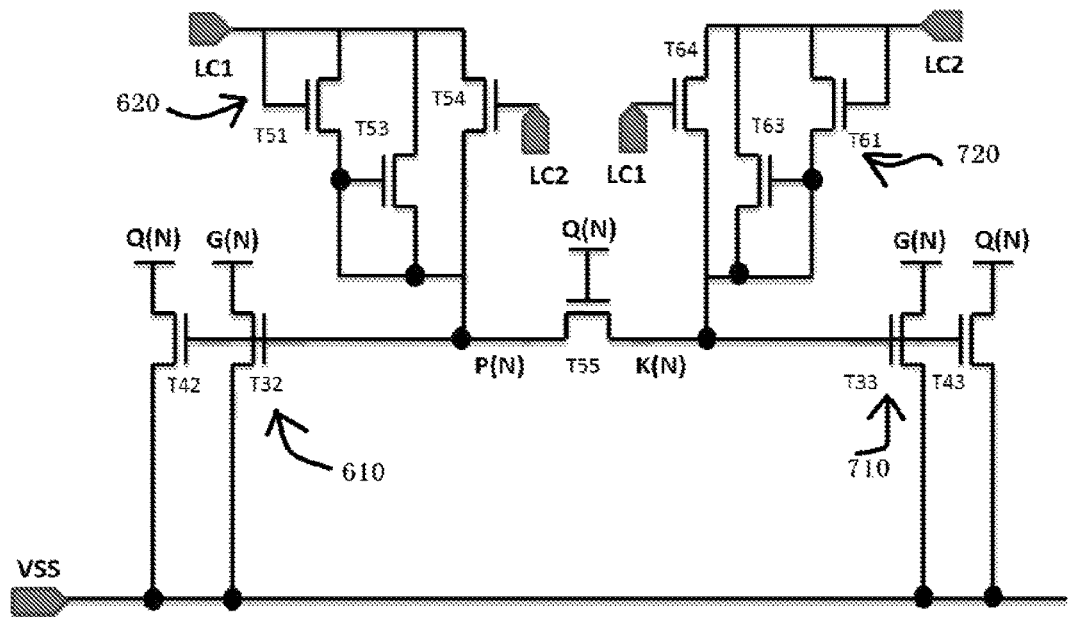
FIG. 7 is a second schematic diagram of the scan driving circuit in the fifth example of the present disclosure.

FIG. 7 is a second schematic diagram of the fifth example of the present disclosure, and is improved according to FIG. 6, the difference between FIG. 6 and FIG. 7 is following: The first pull-down maintaining control unit 620 further comprises the fourth controllable switch T53, and the second pull-down maintaining control unit 720 further comprises the eleventh controllable switch T63. The control end of the fourth controllable switch T53 is coupled to the output end of the third controllable switch T51, the output end of the fourth controllable switch T53 is coupled to the output end of the third controllable switch T51 and the control ends of the first and second controllable switches (T32, T42), and the first and second pull-down maintaining signals (LC1, LC2) are sent to the input end of the fourth controllable switch T53. The control end of the eleventh controllable switch T63 is coupled to the output end of the tenth controllable switch T61, the output end of the eleventh controllable switch T63 is coupled to the output end of the tenth controllable switch T61 and the control ends of the eighth and ninth controllable switches (T33, T43), and the first and second pull-down maintaining signals (LC1, LC2) are sent to the input end of the eleventh controllable switch T63.

Figure 8:
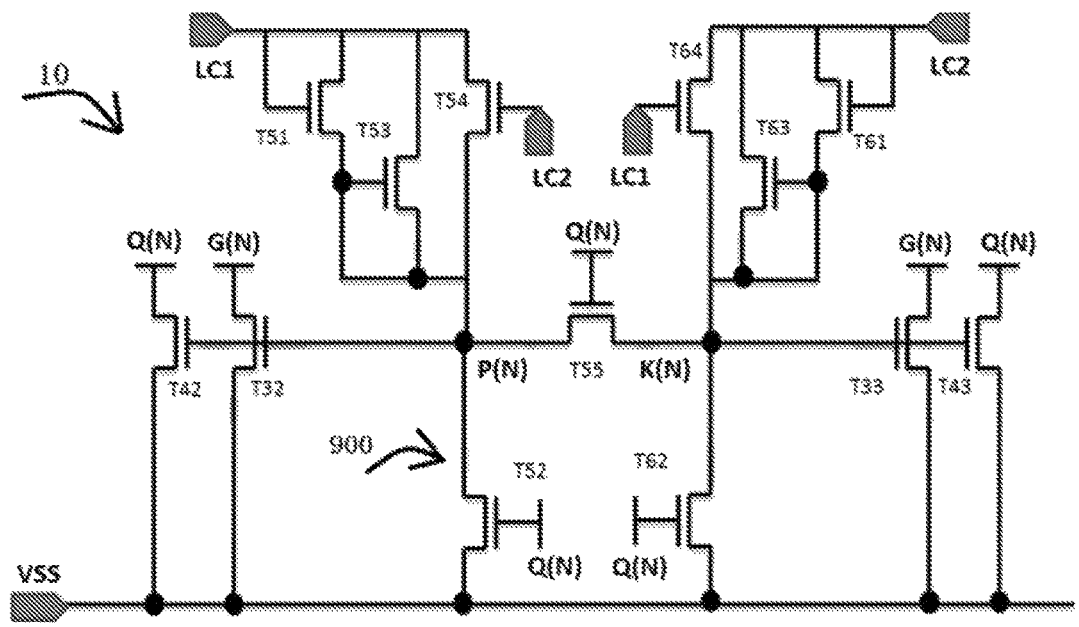
FIG. 8 is a third schematic diagram of the scan driving circuit in the fifth example of the present disclosure.

FIG. 8 is a third schematic diagram of the fifth example of the present disclosure, and is improved according to FIG. 4, the difference between FIG. 8 and FIG. 4 is following: The pull-down maintaining assembly 10 further comprises the turn-off unit 900. The turn-off unit 900 comprises the sixth controllable switch T52 and the thirteenth controllable switch T62. The control end of the sixth controllable switch T52 is coupled to the output end Q(N) of the pull-up control assembly 100, the input end of the sixth controllable switch T52 is coupled to the point P(N) of the control ends of the first and second controllable switches (T32, T42), and the reference low-level signal is sent to the output end of the sixth controllable switch T52. The control end of the thirteenth controllable switch T62 is coupled to the output end Q(N) of the pull-up control assembly 100, the input end of the thirteenth controllable switch T62 is coupled to the point K(N) of the control ends of the eighth and ninth controllable switches (T33, T43), and the reference low-level signal VSS is sent to the output end of the thirteenth controllable switch T62.

When the current scanning line G(N) is active, the sixth and thirteenth controllable switches (T52, T62) assist in reducing the electric potentials at point P(N) and point K(N).

Thus, the pull-down maintaining assembly turns off, and the influence on the GOA due to the pull-down maintaining assembly is avoided.

Figure 9:
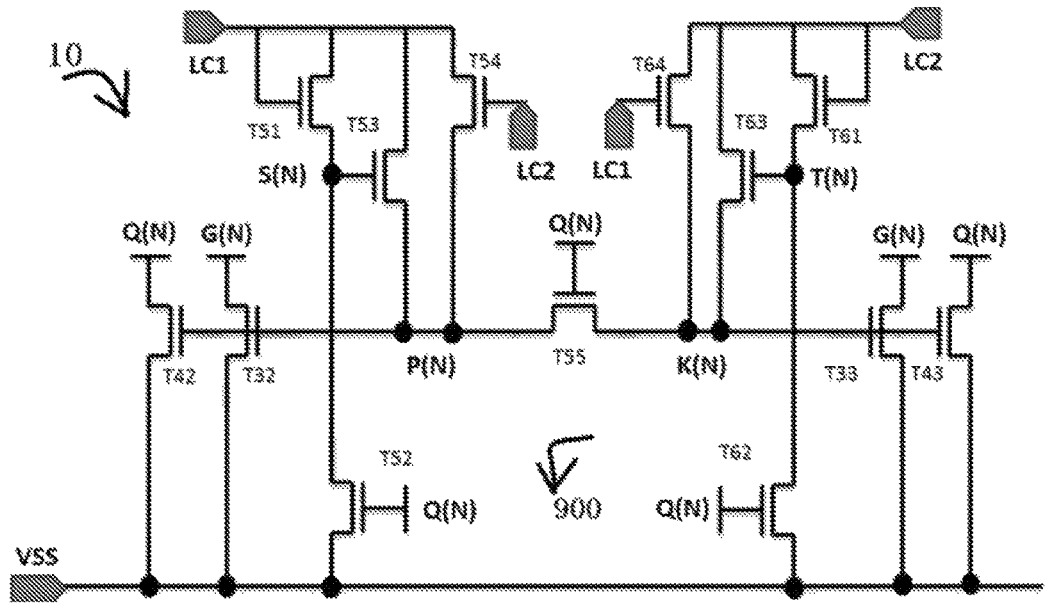
FIG. 9 is a fourth schematic diagram of the scan driving circuit in the fifth example of the present disclosure.

FIG. 9 is a fourth schematic diagram of the fifth example of the present disclosure, and is improved according to FIG. 7. In the example, the pull-down maintaining assembly 10 further comprises the turn-off unit 900. The turn-off unit 900 comprises the sixth controllable switch T52 and the thirteenth controllable switch T62. The control end of the sixth controllable switch T52 is coupled to the output end Q(N) of the pull-up control assembly 100, the input end of the sixth controllable switch T52 is coupled to the point S(N) of the control end of the fourth controllable switch T53, and the reference low-level signal VSS is sent to the output end of the sixth controllable switch T52. The control end of the thirteenth controllable switch T62 is coupled to the output end Q(N) of the pull-up control assembly 100, the input end of the thirteenth controllable switch T62 is coupled to the point T(N) of the control end of the eleventh controllable switch T63, and the reference low-level signal VSS is sent to the output end of the thirteenth controllable switch T62.

The reference low-level signal VSS comprises the first reference low-level signal VSS1 and the second reference low-level signal VSS2.

Example 6

Figure 10:
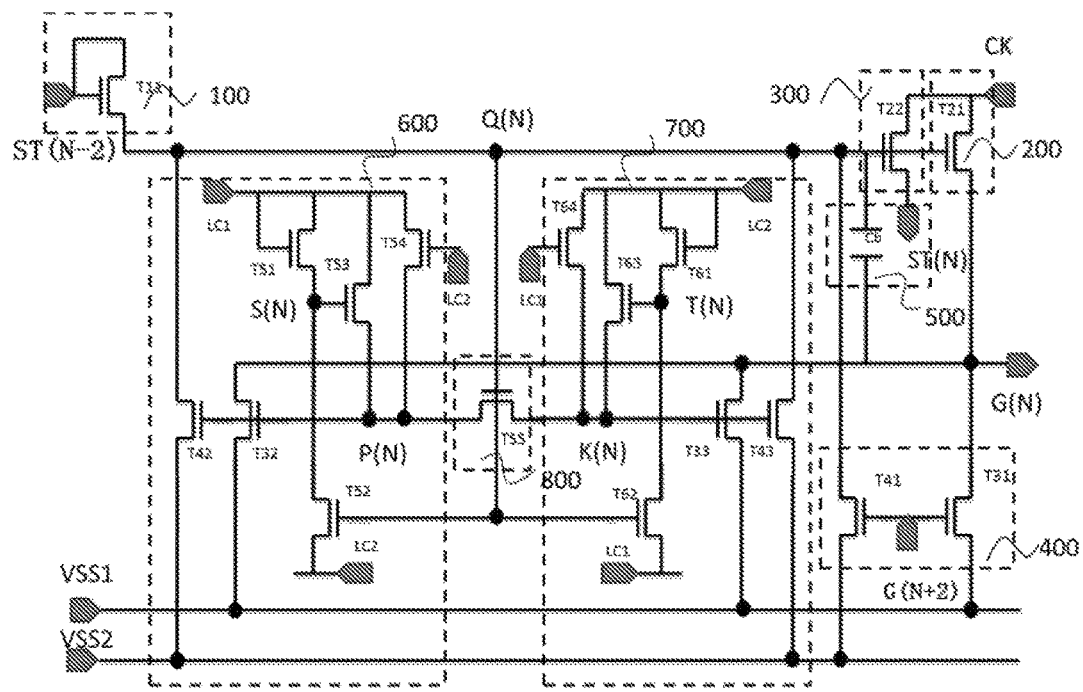
FIG. 10 is a first schematic diagram of a scan driving circuit in a sixth example of the present disclosure.

FIG. 10 is a first schematic diagram of the sixth example of the present disclosure, and is different from that disclosed in the first example and the fifth example, in FIG. 10, the previous down-transmitting signal ST (N–2) is sent to the control end and the input end of the pull-up control assembly 100, which avoids influence on next-staged GOA circuit from the previous scanning line G(N–2).

Figure 11:
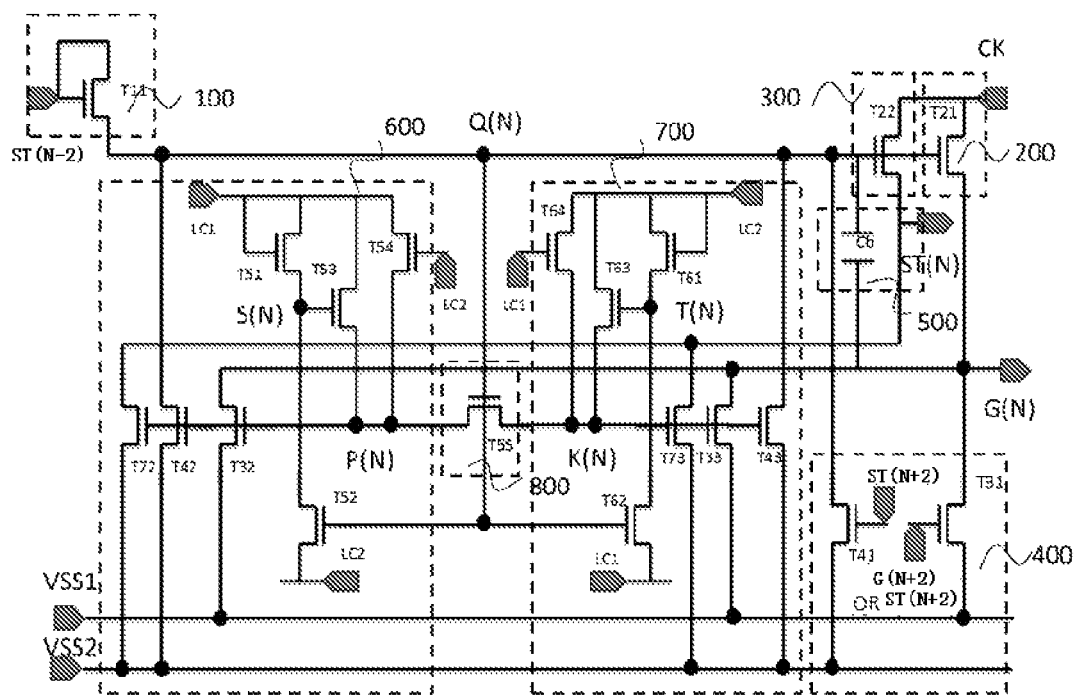
FIG. 11 is a second schematic diagram of the scan driving circuit in the sixth example of the present disclosure.

FIG. 11 is a second schematic diagram of the sixth example of the present disclosure, and is different from the FIG. 10, in FIG. 11, the next scanning line G(N+2) or the next down-transmitting signal ST(N+2) is sent to the control end of the twentieth controllable switch T31 of the pull-down assembly 400, and the next down-transmitting signal is sent to the control end of the twenty-first controllable switch T41.

Figure 12:
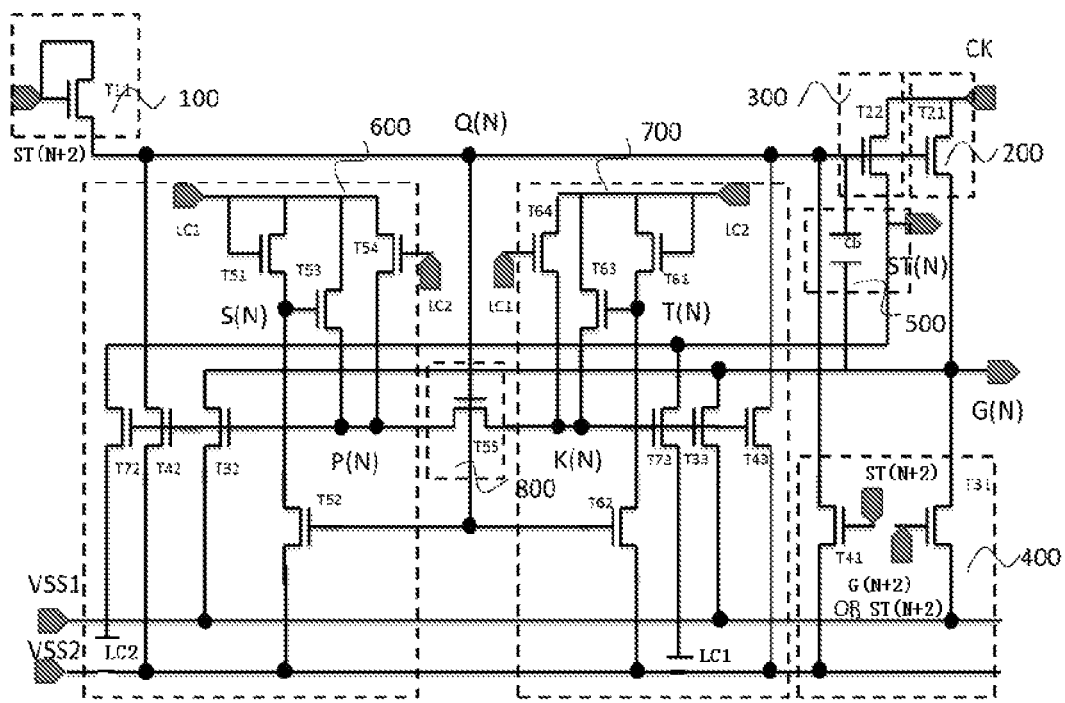
FIG. 12 is a third schematic diagram of the scan driving circuit in the sixth example of the present disclosure.

FIG. 12 is a third schematic diagram of the sixth example of the present disclosure, and is different from the FIG. 11. In FIG. 12, the second pull-down maintaining signal LC2 is sent to the output end of the seventh controllable switch T72, and the first pull-down maintaining signal LC1 is sent to the fourteenth controllable switch.

Example 7

Figure 13:
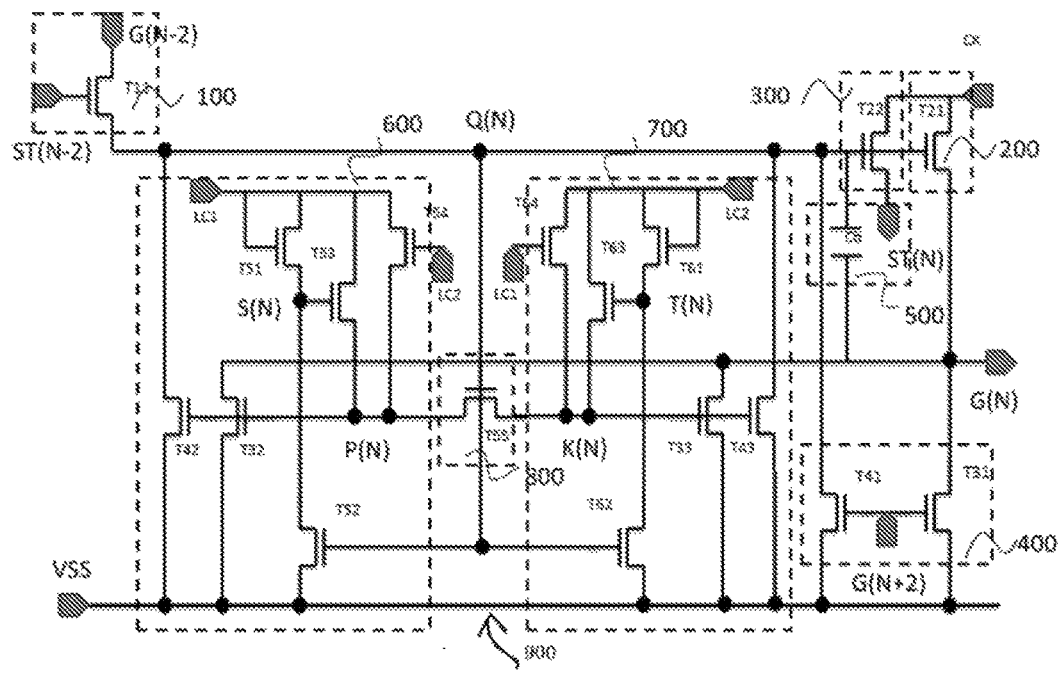
FIG. 13 is a schematic diagram of a scan driving circuit in a seventh example of the present disclosure.
Figure 14:
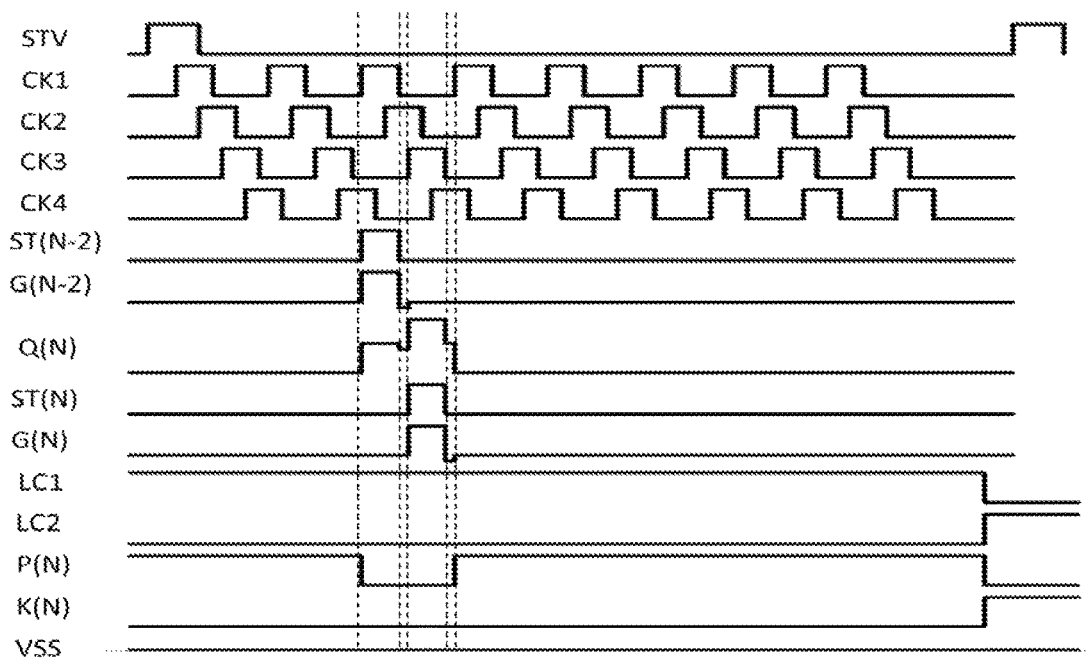
FIG. 14 is a waveform diagram of a first signal of the scan driving circuit in the seventh example of the present disclosure.
Figure 15:
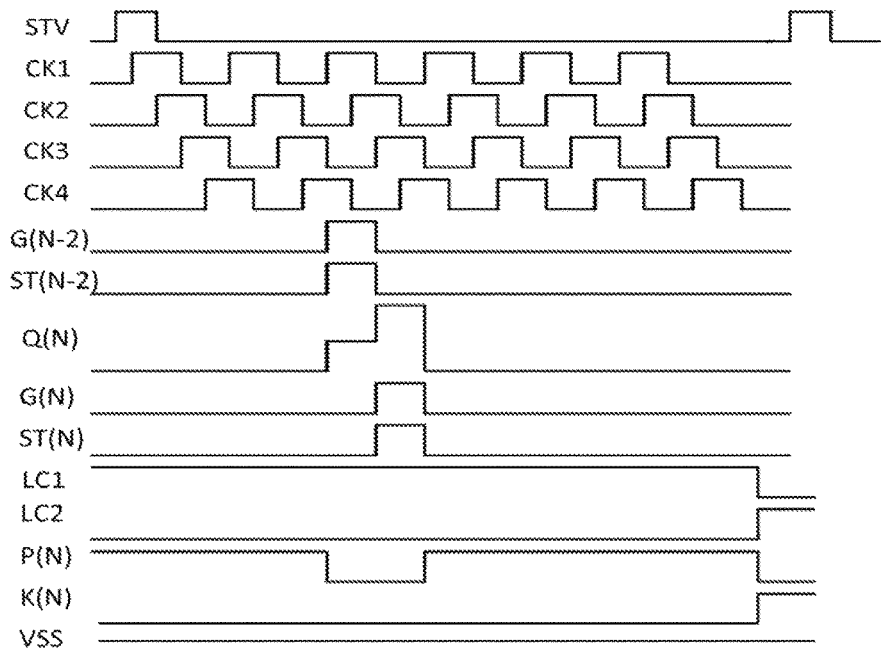
FIG. 15 is a waveform diagram of a second signal of the scan driving circuit in the seventh example of the present disclosure.

FIG. 13 is a first example of the seventh example of the present disclosure, and FIG. 14 and FIG. 15 are waveform diagrams of signals of the scan driving circuit in the seventh example of the present disclosure. In the example, the first pull-down maintaining signal LC1 and the second pull-down maintaining signal LC2 are the low-frequency signals. The low-frequency signals can avoid signal fluctuation of the GOA circuit due to change of the electric potential that is generated during switching the high-frequency between the high-level and the low-level, and combined with the pull-down maintaining assembly, the low-frequency signals allow the pulse periods of the first pull-down maintaining signal LC1 and the second pull-down maintaining signal LC2 not to be limited, and the first pull-down maintaining signal LC1 and the second pull-down maintaining signal LC2 can be used when the electric potentials thereof are complementary, it is good that the time of switching the signal is the blanking time between each frame image. Thus, failure of the GOA due to mismatching waveform of the first pull-down maintaining signal LC1 and the second pull-down maintaining signal LC2, thereby improving the stability of the GOA circuit.

FIG. 14 is a waveform diagram of the clock scanning signal having a duty cycle of 40/60, the clock scanning signal is used to generate high electric potential of the current scanning line G(N), and the pull-down maintaining signal LC is used to control high and low electric potentials of the pull-down maintaining circuit. For example, when the current scanning line G(N) is active, the electric potentials at points P(N) and K(N) are reduced to the low electric potential of the pull-down maintaining signal LC, namely the electric potentials of the control ends of a plurality of TFTs that are used in the pull-down maintaining circuit, such as the first controllable switch T32 and the second controllable switch T42, are at the turn-off status that is less than the electric potential of the reference low-level signal VSS when the current scanning line G(N) is active, which ensures the GOA circuit to work. The reference low-level signal is used to reduce the electric potentials of the current scanning line G(N), the output end Q(N) of the pull-up control assembly, point S(N), and point T(N). When the duty cycle of the clock scanning signal is 40/60, the electric potential of the current scanning line G(N) is reduced to the low electric potential of the clock scanning signal CKL after the current scanning line G(N) is inactive, and then the electric potential of the current scanning line G(N) is increased to the electric potential of the reference low-level signal VSS, the electric potential of the clock scanning signal CKL is usually less than the electric potential of the reference low-level signal VSS, thus, the current scanning line G(N) is driven through three stages, thereby avoiding clock feed through effect of the TFTs in the pixel display area.

Wherein, the STV is a start signal of the GOA circuit. The start signal STV of the GOA circuit is used to start a first stage GOA circuit, or the first and a second GOA circuit, and the start signal STV of the GOA circuit is also used to reduce the electric potentials of the output ends Q(N) of the pull-up control assemblies of a last stage GOA circuit or a last two stage GOA circuits.

The signals, that are used to output, input, pull up, and pull down, are generated in a work process of the GOA circuit. When the high-frequency clock scanning signal having duty ratio of 40/60 is used, the waveform of the output end Q(N) of the pull-up control assembly is similar to the Chinese character "凸".

FIG. 15 is a waveform diagram of the clock scanning signal having duty cycle of 50/50. Compared with FIG. 14, when the duty cycle of the clock scanning signal is 50/50, the waveform of the output end Q(N) of the pull-up control assembly changes greatly, and the duty cycle of 50/50 can reduce current leakage of the output end Q(N) of the pull-up control assembly when switching the clock scanning signal, thereby prolonging the working time of the current scanning line.

Example 8

Figure 16:
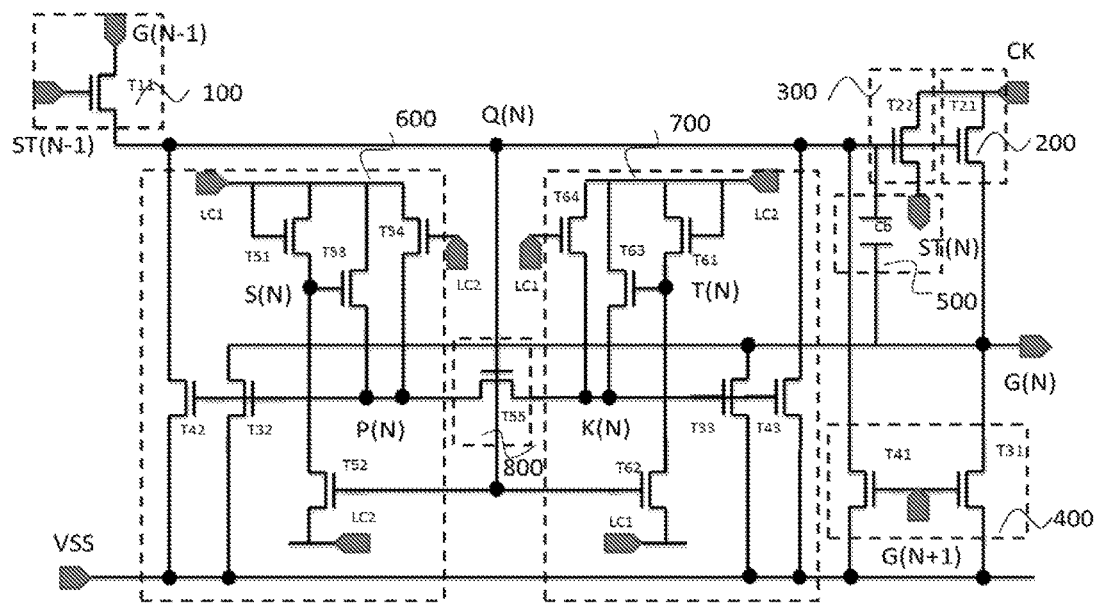
FIG. 16 is a schematic diagram of a scan driving circuit in an eighth example of the present disclosure.

FIG. 16 is a schematic diagram of an eighth example of the present disclosure, and is different from the seventh example. In the example, the first and second pull-down maintaining signals (LC1, LC2) are sent to the output ends of the sixth controllable switch T52 and the thirteenth controllable switch T62, which makes the sixth controllable switch T52 and the thirteenth controllable switch T62 assist in reducing the electric potentials of the first, second, eighth, and ninth controllable switches (T32, T42, T33, T43), thus, the first, second, eighth, and ninth controllable switches (T32, T42, T33, T43) are at safe turn-off status, thereby reducing current leakage.

Figure 17:
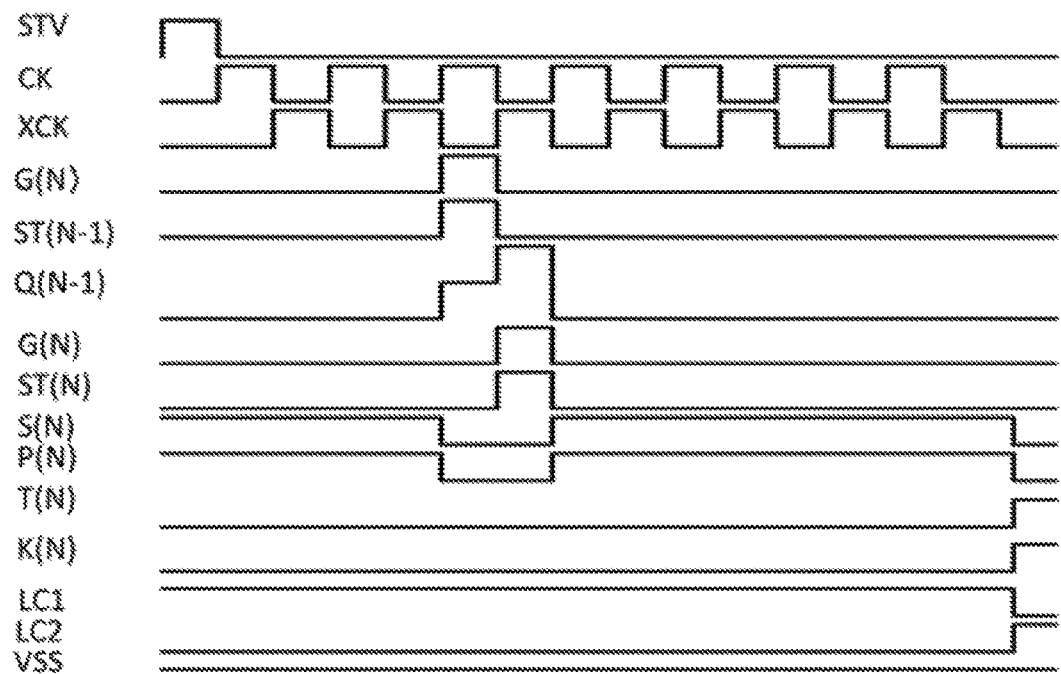
FIG. 17 is a waveform diagram of a signal in the eighth example of the present disclosure.

FIG. 17 is waveform diagram of the signal of the circuit in FIG. 16. Compared with FIG. 15, in FIG. 17, the waveform diagrams of the signals of points S(N) and T(N) are added.

Example 9

Figure 18:
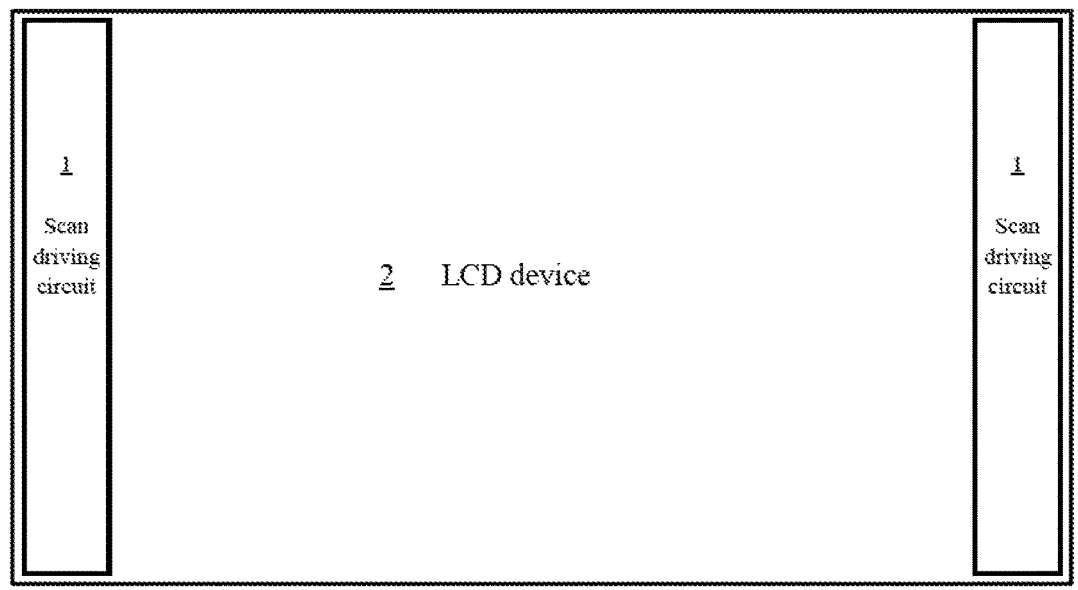
FIG. 18 is a schematic diagram of a liquid crystal display (LCD) device of the present disclosure.

FIG. 18 is a schematic diagram of the LCD device of the present disclosure, the LCD device 2 comprises the scan driving circuit 1 arranged two ends of the LCD device 2, the scan driving circuit 1 is any one of the scan driving circuits of the present disclosure.

The present disclosure is described in detail in accordance with the above contents with the specific exemplary examples. However, this present disclosure is not limited to the specific examples. For the ordinary technical personnel of the technical field of the present disclosure, on the premise of keeping the conception of, the technical personnel can also make simple deductions or replacements, and all of which should be considered to belong to the protection scope of the present disclosure.

I claim:
1. A scan driving circuit, comprising:
a pull-up assembly;
a pull-up control assembly that drives the pull-up assembly;
a pull-down maintaining assembly;
a reference low-level signal; and
a pull-down maintaining signal;
wherein an output end of the pull-up assembly is coupled to a current scanning line, and the reference low-level signal is sent to the output end of the pull-up control assembly and the current scanning line via the pull-down maintaining assembly; the pull-down maintaining signal is sent to a control end of the pull-down maintaining assembly;
when the current scanning line is active, a voltage of the pull-down maintaining signal is less than a voltage of the reference low-level signal, and the pull-down maintaining assembly is controlled by the pull-down maintaining signal to make the reference low-level signal be not sent to the output end of the pull-up control assembly and the current scanning line, wherein the pull-down maintaining assembly comprises a first pull-down maintaining assembly and a second pull-down maintaining assembly; input ends of the first pull-down maintaining assembly and the second pull-down maintaining assembly are coupled to the output end of the pull-up control assembly, the pull-down maintaining signal is sent to control ends of the first pull-down maintaining assembly and the second pull-down maintaining assembly, and the reference low-level signal is sent to output ends of the first pull-down maintaining assembly and the second pull-down maintaining assembly;
the scan driving circuit further comprises a diverter switch connected between the control ends of the first pull-down maintaining assembly and the second pull-down maintaining assembly, and a control end of the diverter switch is coupled to the output end of the pull-up control assembly;

when the current scanning line is active, the diverter switch turns of the first pull-down maintaining assembly and the second pull-down maintaining assembly, thus, the reference low-level signal is not sent to the output end of the pull-up control assembly and the current scanning line.

2. The scan driving circuit of claim 1, wherein the first pull down maintaining control unit drives the first pull down maintaining unit; the first pull-down maintaining unit comprises a first controllable switch and a second controllable switch; the pull-down maintaining signal comprises a first pull-down maintaining signal, and the first pull-down maintaining signal is sent to control ends of the first controllable switch and the second controllable switch via the first pull-down maintaining control unit; the reference low-level signal is sent to the current scanning line via the first controllable switch, and is sent to the output end of the pull-up control assembly via the second controllable switch;

when the current scanning line is inactive, the first pull-down maintaining control unit controls the first controllable switch and the second controllable switch to turn on according to the first pull-down maintaining signal; the first controllable switch controls the reference low-level signal to be sent to the current scanning line, and the second controllable switch controls the reference low-level signal to be sent to the output end of the pull-up control assembly;

when the current scanning line is active, the first controllable switch and the second controllable switch turn off; the first controllable switch controls the reference low-level signal to be not sent to the current scanning line, and the second controllable switch controls the reference low-level signal to be not sent to the output end of the pull-up control assembly.

3. The scan driving circuit of claim 2, wherein the first pull-down maintaining control unit comprises a third controllable switch, connection method of the third controllable switch is a diode connection method, the first pull-down maintaining signal is sent to an input end and a control end of the third controllable switch.

4. The scan driving circuit of claim 3, wherein the first pull-down maintaining unit further comprises a fourth controllable switch, a control end of the fourth controllable switch is coupled to an output end of the third controllable switch, the first pull-down maintaining signal is sent to an input end of the fourth controllable switch, and an output end of the fourth controllable switch is coupled to the control ends of the first and second controllable switches.

5. The scan driving circuit of claim 3, wherein the first pull-down maintaining unit further comprises a fifth controllable switch; the pull-down maintaining signal further comprises a second pull-down maintaining signal LC2, logical operation of the second pull-down maintaining signal is opposite to logical operation of the first pull-down maintaining signal LC1; the second pull-down maintaining signal is sent to a control end of the fifth controllable switch, the first maintaining signal is sent to an input end of the fifth controllable switch, and an output end of the fifth controllable switch is coupled to the control ends of the first and second controllable switches.

6. The scan driving circuit of claim 2, Wherein the first pull-down maintaining control unit comprises a third controllable switch, a fourth controllable switch, and a fifth controllable switch; the pull-down maintaining signal further comprises a second pull-down maintaining signal, and logical operation of the second pull-down maintaining signal is opposite to logical operation of the first pull-down maintaining signal; the third controllable switch uses a diode connection method, the first pull-down maintaining signal is sent to an input end and a control end of the third controllable switch; a control end of the fourth controllable switch is coupled to an output end of the third controllable switch, the first and second pull-down maintaining signals are sent to an input end of the fourth controllable switch, and an output end of the fourth controllable switch is coupled to the control ends of the first and second controllable switches; the second pull-down maintaining signal is sent to a control end of the fifth controllable switch, the first pull-down maintaining signal is sent to an input end of the fifth controllable switch, and an output end of the fifth controllable switch is coupled to the control ends of the first and second controllable switches.

7. The scan driving circuit of claim 6, Wherein the pull-down maintaining assembly further comprises a turn-off unit, and the turn-off unit comprises a sixth controllable switch; a control end of the sixth controllable switch is coupled to the output end of the pull-up control assembly, an input end of the sixth controllable switch is coupled to the control end of the fourth controllable switch, and the reference low-level signal is sent to an output end of the sixth controllable switch.

8. The scan driving circuit of claim 6, wherein the pull-down maintaining assembly further comprises a turn-off unit, and the turn-off unit comprises a sixth controllable switch; a control end of the sixth controllable switch is coupled to the output end of the pull-up control assembly, an input end of the sixth controllable switch is coupled to the control end of the fourth controllable switch, and the second pull-down maintaining signal is sent to an output end of the sixth controllable switch.

9. The scan driving circuit of claim 2, wherein the pull-down maintaining assembly further comprises a second pull-down maintaining assembly comprising a second pull-down maintaining unit and a second pull-down maintaining control unit, the second pull-down maintaining control unit drives the second pull-down maintaining unit; the pull-down maintaining signal comprises a second pull-down maintaining signal, logical operation of the second pull-down maintaining signal is opposite to logical operation of the first pull-down maintaining signal; the second pull-down maintaining unit comprises an eighth controllable switch and a ninth controllable switch; the second pull-down maintaining signal is sent to control ends of the eighth and ninth controllable switches via the second pull-down maintaining control unit; the reference low-level signal is sent to the current scanning line via the eighth controllable switch, and is sent to the output end of the pull-up control assembly via the ninth controllable switch; when the current scanning line is inactive, the first pull-down maintaining unit and the second pull-down maintaining unit alternately turn on; when the second pull-down maintaining unit turn on, the eighth and ninth controllable switches turn on, sending the reference low-level signal to the output end of the pull-up control assembly and the current scanning line;

when the current scanning line is active, the first pull-down maintaining unit and the second pull-down maintaining unit turn off, and the first, second, eighth, and ninth controllable switches turn off, thus, the reference low-level signal is not sent to the output end of the pull-up control assembly and the current scanning line.

10. The scan driving circuit of claim 9, wherein the pull-down maintaining assembly further comprises a diverter switch, a control end of the diverter switch is coupled to the output end of the pull-up control assembly, and the diverter switch is arranged between the control ends of the first and second controllable switches and the control ends of the eighth and ninth controllable switches;

when the current scanning line is active, the diverter switch turns on, connecting the first pull-down maintaining unit to the second pull-down maintaining unit, and electric potential of one of the control ends of the first and second pull-down maintaining units that is at high level, is reduced by electric potential of another control end that is at low level, thus, the first and second pull-down maintaining units turn off.

11. The scan driving circuit of claim 9, wherein the second pull-down maintaining control unit comprises a tenth controllable switch, the tenth controllable switch uses a diode connection method, the second pull-down maintaining signal is sent to an input end and a control end of the tenth controllable switch.

12. The scan driving circuit of claim 11, wherein the second pull-down maintaining unit further comprises an eleventh controllable switch, a control end of the eleventh controllable switch is coupled to an output end of the tenth controllable switch, the second pull-down maintaining signal is sent to an input end of the eleventh controllable switch, and an output end of the eleventh controllable switch is coupled to the control ends of the eighth and ninth controllable switches.

13. The scan driving circuit of claim 11, wherein the second pull-down maintaining unit farther comprises a twelfth controllable switch, the first pull-down maintaining signal is sent to a control end of the twelfth controllable switch, the second pull-down maintaining signal is sent to an input end of the twelfth controllable switch, and an output end of the twelfth controllable switch is coupled to the control ends of the eighth and ninth controllable switches.

14. The scan driving circuit of claim 9, wherein the second pull-down maintaining control unit comprises a tenth controllable switch, an eleventh controllable switch, and a twelfth controllable switch; the tenth controllable switch uses a diode connection method, the second pull-down maintaining signal is sent to an input end and a control end of the tenth controllable switch; a control end of the eleventh controllable switch is coupled to an output end of the tenth controllable switch, the second pull-down maintaining signals is sent to an input end of the eleventh controllable switch, and an output end of the eleventh controllable switch is coupled to the control ends of the eighth and ninth controllable switches; the first pull-down maintaining signal is sent to a control end of the twelfth controllable switch, the second pull-down maintaining signal is sent to an input end of the twelfth controllable switch, and an output end of the twelfth controllable switch is coupled to the control ends of the eighth and ninth controllable switches;

when the current scanning line is inactive and the second pull-down maintaining assembly turns on, the tenth, eleventh, and twelfth controllable switches control the eighth and ninth controllable switches to turn on according to the first and second pull-down maintaining signals, sending the reference low-level signal to the output end of the pull-up control assembly and the current scanning line.

15. The scan driving circuit of claim 14, wherein the pull-down maintaining assembly further comprises a turn-off unit, the turn-off unit comprises a thirteenth controllable switch; a control end of the thirteenth controllable switch is coupled to the output end of the pull-up control assembly, an input end of the thirteenth controllable switch is coupled to the control end of the eleventh controllable switch, and the reference low-level signal is sent to an output end of the thirteenth controllable switch.

16. The scan driving circuit of claim 14, wherein the pull-down maintaining assembly further comprises a turn-off unit, the turn-off unit comprises a thirteenth controllable switch; a control end of the thirteenth controllable switch is coupled to the output end of the pull-up control assembly, an input end of the thirteenth controllable switch is coupled to the control end of the eleventh controllable switch, and the first pull-down maintaining signal is sent to an output end of the thirteenth controllable switch.

17. The scan driving circuit of claim 9, wherein the first pull-down maintaining signal and the second pull-down maintaining signal are low-frequency signals, and a time of switching the first and second pull-down maintaining signals is a blanking time between each frame image.

18. The scan driving circuit of claim 1, wherein the pull-up control assembly comprises a seventeenth controllable switch an output end of the seventeenth controllable switch is coupled to a control end of the pull-up assembly, and a pull-up control signal is sent to a control end and an input end of the seventeenth controllable switch; the pull-up assembly comprises an eighteenth controllable switch, a control end of the eighteenth controllable switch is coupled to the output end of the pull-up control assembly, a clock scanning signal is sent to an input end of the eighteenth controllable switch, and an output end of the eighteenth controllable switch is coupled to the current scanning line: the scan driving circuit further comprises a storage capacitor, a first end of the storage capacitor is coupled to the output end of the pull-up control assembly, and a second end Of the storage capacitor is coupled to the output end of the pull-up assembly.

19. A liquid crystal display (LCD) device, comprising:
a scan driving circuit; and
wherein the scan driving circuit comprises a pull-tip assembly, a pull-up control assembly that drives the pull-up assembly, a pull-down maintaining assembly, a reference low-level signal, and a pull-down maintaining signal; an output end of the pull-up assembly is coupled to a current scanning line, and the reference signal is sent to the output end of the pull-up control assembly and the current scanning line via the pull-down maintaining assembly; the pull-down maintaining signal is sent to a control end of the pull-down maintaining assembly;

when the current scanning line is active, a voltage of the pull-down maintaining signal is less than a voltage of the reference low-level signal, and the pull-down maintaining assembly is controlled by the pull-down maintaining signal to make the reference low-level signal be not sent to the output end of the pull-up control assembly and the current scanning line, wherein the pull-down maintaining assembly comprises as first pull-down maintaining assembly and a second pull-down maintaining assembly; input ends of the first pull-down maintaining Assembly and the second pull-down maintaining assembly are coupled to the output end of the pull-up control assembly, the pull-down maintaining signal is sent to control ends of the first pull-down maintaining assembly and the second pull-down maintaining assembly, and the reference low-level signal is sent to output ends of the first pull-down maintaining assembly and the second pull-down maintaining assembly;

the scan driving circuit further comprises a diverter switch connected between the control ends of the first pull-down maintaining assembly and the second pull-down maintaining assembly, and a control end of the diverter switch is coupled to the output end of the pull-up control assembly;

when the current scanning line is active, the diverter switch turns off the first pull-down maintaining assembly and the second pull-down maintaining assembly, thus, the reference low-level signal is not sent to the output end of the pull-up control assembly and the current scanning line.

20. A scan driving circuit, comprising:

a pull-up assembly;

a pull-up control assembly that drives the pull-up assembly;

a pull-down maintaining assembly;

a reference low-level signal; and a pull-down maintaining signal;

wherein an output end of the pull-up assembly is coupled to a current scanning line, and the reference low-level signal is sent to the output end of the pull-up control assembly and the current scanning line via the pull-down maintaining assembly; the pull-down maintaining signal is sent to a control end of the pull-down maintaining assembly;

when the current scanning line is active, a voltage of the pull-down maintaining signal is less than a voltage of the reference low-level signal, and the pull-down maintaining assembly is controlled by the pull-down maintaining signal to make the reference low-level signal be not sent to the output end of the pull-up control assembly and the current scanning line, wherein the pull-down maintaining assembly comprises a first pull-down maintaining assembly, and the first pull-down maintaining assembly comprises a first pull-down maintaining unit and a first pull-down maintaining control unit, the first pull-down Maintaining control unit drives the first pull-down maintaining unit; the first pull-down maintaining unit comprises a first controllable switch and a second controllable switch; the pull-down maintaining signal comprises a first pull-down maintaining signal, and the first pull-down maintaining signal is sent to control ends of the first controllable switch and the second controllable switch via the first pull-down maintaining control unit; the reference low-level signal is sent to the current scanning line via the first controllable switch, and is sent to the output end of the pull-up control assembly via the second controllable switch;

when the current scanning line is inactive, the first pull-down maintaining control unit controls the first controllable switch and the second controllable switch to turn on according to the first pull-down maintaining signal; the first controllable switch controls the reference low-level signal to be sent to the current scanning line, and the second controllable switch controls the reference low-level signal to be sent to the output end of the pull-up control assembly;

when the current scanning line is active, the first controllable switch and the second controllable switch turn off; the first controllable switch controls the reference low-level signal to be not sent to the current scanning line, and the second controllable switch controls the reference low-level signal to be not sent to the output end of the pull-up control assembly;

wherein the first pull-down maintaining control unit comprises a third controllable switch, connection method of the third controllable switch is a diode connection method, the first pull-down maintaining signal is sent to an input end and a control end of the third controllable switch;

wherein the first pull-down maintaining unit further comprises a fourth controllable switch, a control end of the fourth controllable switch is coupled to an output end of the third controllable switch, the first pull-down maintaining signal is sent to an input end of the fourth controllable switch, and an output end of the fourth controllable switch is coupled to the control ends of the first and second controllable switches.

* * * * *